US009076885B2

(12) United States Patent
Yoshimochi

(10) Patent No.: US 9,076,885 B2
(45) Date of Patent: Jul. 7, 2015

(54) MANUFACTURING METHOD OF SEMICONDUCTOR DEVICE

(71) Applicant: ROHM CO., LTD., Kyoto (JP)

(72) Inventor: Kenichi Yoshimochi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/560,294

(22) Filed: Dec. 4, 2014

(65) Prior Publication Data

US 2015/0087122 A1      Mar. 26, 2015

Related U.S. Application Data

(62) Division of application No. 13/887,051, filed on May 3, 2013, now Pat. No. 8,928,072.

(30) Foreign Application Priority Data

May 9, 2012 (JP) ................................ 2012-107673

(51) Int. Cl.
*H01L 21/336* (2006.01)
*H01L 21/8234* (2006.01)
*H01L 27/06* (2006.01)
*H01L 29/66* (2006.01)
*H01L 29/423* (2006.01)

(52) U.S. Cl.
CPC ........ *H01L 21/8234* (2013.01); *H01L 27/0629* (2013.01); *H01L 29/66143* (2013.01); *H01L 29/66666* (2013.01); *H01L 29/4236* (2013.01)

(58) Field of Classification Search
CPC .............. H01L 29/47; H01L 29/4236; H01L 29/66727; H01L 29/66734; H01L 29/7813
USPC .......... 438/242, 259, 270, 561; 257/282, 284, 257/330, E21.384
See application file for complete search history.

(56) References Cited

U.S. PATENT DOCUMENTS

| 7,745,878 B2 | 6/2010 | Bhalla et al. |
| 8,193,579 B2 * | 6/2012 | Yoshimochi ................. 257/331 |
| 2009/0057757 A1 | 3/2009 | Hokomoto et al. |

FOREIGN PATENT DOCUMENTS

JP            2009-59860 A      3/2009

* cited by examiner

*Primary Examiner* — Dung Le
(74) *Attorney, Agent, or Firm* — Chen Yoshimura LLP

(57) ABSTRACT

Provided is a semiconductor device that can be manufactured at low cost and that can reduce a reverse leak current, and a manufacturing method thereof. A semiconductor device has: a source region and a drain region having a body region therebetween; a source trench that reaches the body region, penetrating the source region; a body contact region formed at the bottom of the source trench; a source electrode embedded in the source trench; and a gate electrode that faces the body region. The semiconductor device also has: an n-type region for a diode; a diode trench formed reaching the n-type region for a diode; a $p^+$ region for a diode that forms a pn junction with the n-type region for a diode at the bottom of the diode trench; and a schottky electrode that forms a schottky junction with the n-type region for a diode at side walls of the diode trench.

5 Claims, 20 Drawing Sheets

MANUFACTURING METHOD OF SEMICONDUCTOR DEVICE

This application is a divisional of a pending application, U.S. Ser. No. 13/887,051 filed on May 3, 2013, now U.S. Pat. No. 8,928,072, which is hereby incorporated by reference in its entirety. The parent application claims the benefit of Japanese Application No. 2012-107673, filed in Japan on May 9, 2012, the entire contents of which is incorporated herein by reference.

BACKGROUND OF THE INVENTION

1. Field of the Invention

The present invention relates to a semiconductor device and a manufacturing method thereof.

2. Description of Related Art

The semiconductor device disclosed in Patent Document 1 includes a schottky barrier diode connected between the source and the drain. More specifically, in the semiconductor device, a p-type base layer is formed in the surface portion of an n-type semiconductor layer formed on an n-type semiconductor substrate. A trench is formed from the surface of the n-type semiconductor layer so as to penetrate the p-type base layer, and on the side walls and the bottom of the trench, a gate insulating film is formed. A gate electrode is embedded in the trench. An n-type diffusion layer is formed in a surface portion of the p-type base layer.

With this configuration, this semiconductor device is equipped with a trench gate type transistor. In this transistor, the n-type diffusion layer is a source region, the n-type semiconductor layer is a drain region, and a channel is formed near the boundary between the gate insulating film and the p-type base layer formed between the n-type diffusion layer and the n-type semiconductor layer. As a result, an electric current flows between the source region and the drain region.

A metal layer is deposited on the surface of the n-type semiconductor layer. The metal layer is in contact with the n-type diffusion layer, thereby functioning as a source electrode, and also, by the metal layer being in contact with the surface of the n-type semiconductor layer in a region where the p-type base layer is not formed, a schottky junction is formed between the region and the metal layer. As described above, in this semiconductor device, a transistor and a schottky barrier diode are formed in one chip.

RELATED ART DOCUMENTS

Patent Documents

Patent Document 1: Japanese Patent Application Laid-Open Publication No. 2009-59860

SUMMARY OF THE INVENTION

In manufacturing the semiconductor device of Patent Document 1, it is necessary to form a protective film on the entire surface of the n-type semiconductor layer before the trench for embedding the gate electrode therein is formed. In this case, after forming the trench, it is necessary to remove the protective film from a region where the schottky barrier diode is to be formed. This makes the manufacturing process of the semiconductor device complex, and as a result, it becomes difficult to manufacture a semiconductor device at low cost.

Also, in order to improve the performance of the schottky barrier diode, a reduction in reverse leak current in a reverse bias state is sought after.

One of the objects of the present invention is to provide a semiconductor device that can be manufactured at low cost and that can reduce the reverse leak current, and a manufacturing method thereof.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in the first aspect of the present invention, a semiconductor device has: a semiconductor layer of a first conductive type; a body region of a second conductive type formed in the semiconductor layer of the first conductive type; a source region and a drain region of the first conductive type formed in the semiconductor layer so as to be separated from each other across the body region; a source trench formed in the semiconductor layer, the source trench penetrating the source region and reaching the body region; a body contact region formed near a bottom of the source trench and in the semiconductor layer of the first conductive type that includes the body region, the body contact region being the second conductive type and having a higher impurity concentration than that of the body region; a source electrode embedded in the source trench; a gate electrode facing through a gate insulating layer the body region that lies between the source region and the drain region; a first conductive type region for a diode formed in the semiconductor layer; a diode trench formed in the semiconductor layer that includes the first conductive type region for a diode; a second conductive type region for a diode formed in the first conductive type region for a diode so as to be in contact with a bottom of the diode trench, the second conductive type region for a diode forming a pn junction with the first conductive type region for a diode; and a schottky electrode forming a schottky junction with the first conductive type region for a diode at side walls of the diode trench.

With this configuration, a transistor is formed in the semiconductor layer outside of the diode forming region. In the diode forming region, a pn diode is formed at the bottom of the diode trench, and a schottky barrier diode is formed at side walls of the diode trench. In this case, the source trench and the diode trench can be formed at the same time. Also, it is possible to form the body contact region at the bottom of the source trench at the same time as forming the second conductive type region for a diode at the bottom of the diode trench. Furthermore, it is possible to embed the source electrode in the source trench at the same time as forming the schottky electrode in the diode trench. In this way, the transistor and the diode can be formed at the same time, and therefore, it is possible to omit a process that would be needed if the transistor and the diode were formed in different processes (such as a process of forming a protective film on the surface of the semiconductor layer and removing the protective film in the diode region after forming the source trench). As described above, because the diode trench and the second conductive type region for a diode can be formed in the process for forming the transistor (or in other words, because a special process for forming the diode is no longer necessary), it is possible to form a semiconductor device that has a transistor and a schottky barrier diode on the same chip with a smaller number of manufacturing steps. As a result, the semiconductor device can be manufactured at low cost.

In a reverse bias state, a depletion layer spreads around the pn diode at the bottom of the diode trench, which blocks the path of an electrical current in the diode region, and as a result, the reverse leak current can be reduced.

In the second aspect of the present invention, the diode trench has the same depth as that of the source trench. With this configuration, the diode trench and the source trench can be formed in the semiconductor layer at the same time with the same etching conditions, for example.

In the third aspect of the present invention, the semiconductor device further includes: a first interlayer insulating film that insulates the gate electrode and the source electrode from each other; and a second interlayer insulating film disposed between the schottky electrode and a surface of the first conductive type region for a diode outside of the diode trench. With this configuration, it is possible to insulate the gate electrode and the source electrode from each other by the first interlayer insulating film, and it is possible to insulate the schottky electrode and the surface of the first conductive type region for a diode outside of the diode trench from each other.

In the fourth aspect of the present invention, the first interlayer insulating film and the second interlayer insulating film have the same thickness.

With this configuration, in manufacturing the semiconductor device, it is possible to form the source trench and the diode trench at the same time after an interlayer insulating film that becomes the first interlayer insulating film and the second interlayer insulating film is formed on the entire surface of the semiconductor layer. Also, the second conductive type region for a diode can be formed at the bottom of the diode trench at the same time as forming the body contact region near the bottom of the source trench. At the side walls of the diode trench, a schottky barrier diode can be formed. In this case, it is not necessary to remove the interlayer insulating film. In this configuration, the first interlayer insulating film and the second interlayer insulating film can be formed in the same step.

In the fifth aspect of the present invention, the schottky electrode has a first thickness at the side walls of the diode trench, and a second thickness that is greater than the first thickness on the second interlayer insulating film.

If the thickness of a portion of the schottky electrode forming a schottky junction with the first conductive type region for a diode differs depending on places, a plurality of schottky barrier diodes having slightly different forward voltages (Vf) are connected in parallel, which can cause the characteristics of the entire schottky barrier diodes to be unstable. By contrast, with the configuration of the invention according to claim 5, only the portion of the schottky electrode having the first thickness forms the schottky junction with the first conductive type region for a diode at the side walls of the diode trench, and the portion of the schottky electrode having the second thickness does not form the schottky junction with the first conductive type region for a diode. As a result, the portion of the schottky electrode forming the schottky junction with the first conductive type region for a diode has a uniform thickness, i.e., the first thickness, and because the variation in Vf can be eliminated, the overall characteristics of the schottky barrier diode can be made stable.

In the sixth aspect of the present invention, a plurality of diode trenches are formed in the diode forming region with a gap therebetween.

In the seventh aspect of the present invention, the gap between the plurality of diode trenches is set such that depletion layers spreading from the respective pn junctions in a reverse bias state are connected to each other. With this configuration, in the reverse bias state, the depletion layers spread and are connected to each other at the bottom portions of adjacent diode trenches, which makes it possible to block the path of an electric current in the first conductive type region for a diode more reliably, and therefore, the reverse leak current can be reduced to a greater degree.

In the eighth aspect of the present invention, the schottky electrode includes a schottky/ohmic electrode layer that forms a schottky contact with the first conductive type region for a diode at side walls of the diode trench and that forms an ohmic contact with the second conductive type region for a diode at a bottom of the diode trench. With this configuration, by forming the schottky/ohmic electrode layer at the side walls and bottom of the diode trench, the schottky barrier diode and the pn diode can be formed at the same time.

In the ninth aspect of the present invention, the source electrode and the schottky electrode are made of the same electrode material. With this configuration, the source electrode and the schottky electrode can be formed in the same step by supplying the electrode material into the source trench and the diode trench.

The tenth aspect of the present invention is the semiconductor device according to any one of claims 1 to 9, wherein the source trench is formed at a surface of the semiconductor layer in a linear shape along a first direction, and wherein the diode trench is formed at the surface of the semiconductor layer in a linear shape along a second direction that is orthogonal to the first direction.

With this configuration, by injecting impurity ions into the source trench and the diode trench at an angle relative to the second direction to form the body contact region and the second conductive type region for a diode, the body contact region is formed at the side walls and the bottom of the source trench, and the second conductive type region for a diode is formed at the bottom of the diode trench. However, because the impurity ions are not injected to a pair of side walls of the diode trench facing each other along the first direction, the second conductive type region for a diode is not formed thereat. This allows the schottky electrode to form a schottky junction at those side walls of the diode trench.

In the eleventh aspect of the present invention, the diode trench is rectangular in a plan view.

In the twelfth aspect of the present invention, the source trench is formed at a surface of the semiconductor layer in a linear shape, and two parallel sides of the diode trench that is rectangular in a plan view are orthogonal to a lengthwise direction of the source trench. With this configuration, by injecting impurity ions into the source trench and the diode trench at an angle relative to the direction orthogonal to the lengthwise direction of the source trench, to form the body contact region and the second conductive type region for a diode, the body contact region is formed at the side walls and the bottom of the source trench, and the second conductive type region for a diode is formed at the bottom of the diode trench. However, because the impurity ions are not injected into a pair of side walls of the diode trench facing each other along the direction orthogonal to the lengthwise direction of the diode trench, the second conductive type region for a diode is not formed at the side walls. This allows the schottky electrode to form a schottky junction at the side walls of the diode trench.

In the thirteen aspect of the present invention, the source region and the drain region are arranged with a gap therebetween along a thickness direction of the semiconductor layer, the source region and the drain region having the body region disposed therebetween, a gate trench that reaches the drain region through the source region and the body region is further provided, and the gate electrode is embedded in the gate trench. With this configuration, when a voltage is applied to the gate electrode, a channel is formed near the gate electrode in the body region, which causes an electric current to flow through the transistor. That is, a trench gate type transistor is constructed.

In the fourteen aspect of the present invention, the diode trench is formed shallower than the gate trench.

In the fifteenth aspect of the present invention, the source region and the drain region are arranged along the surface of the semiconductor layer with a gap therebetween. That is, the transistor is a planar transistor.

In the sixteen aspect of the present invention, a manufacturing method of a semiconductor device includes: forming, in a semiconductor layer of a first conductive type in which the transistor region and a diode region are respectively defined, a body region of a second conductive type in the transistor region, and leaving the diode region as a first conductive type region for a diode; forming a source region and a drain region of the first conductive type so as to be separated from each other across the body region; forming both a source trench in the semiconductor layer and a diode trench in the diode region at the same time, the source trench reaching the body region through the source region; injecting an impurity ion into the semiconductor layer near a bottom of the source trench and near a bottom of the diode trench to form, at the same time, a body contact region near the bottom of the source trench and in the semiconductor layer that includes the body region, and a second conductive type region for a diode near the bottom of the diode trench in the semiconductor layer, the body contact region being the second conductive type and having a higher impurity concentration than that of the body region, the second conductive type region for a diode forming a pn junction with the first conductive type region for a diode; forming a gate electrode facing through a gate insulating layer the body region that lies between the source region and the drain region; and embedding a source electrode in the source trench at the same time as forming a schottky electrode that forms a schottky junction with the first conductive type region for a diode at side walls of the diode trench.

With this method, in the completed semiconductor device, a transistor is formed in the transistor region, and in the diode region, a pn diode is formed at the bottom of the diode trench, and a schottky barrier diode is formed at the side walls of the diode trench. In this case, the source trench and the diode trench can be formed at the same time. Also, it is possible to form the body contact region at the bottom of the source trench at the same time as forming the second conductive type region for a diode at the bottom of the diode trench. Furthermore, it is possible to embed the source electrode in the source trench at the same time as forming the schottky electrode in the diode trench. In this way, the transistor and the diode can be formed at the same time, and therefore, it is possible to eliminate a process that is necessary when the transistor and the diode are formed in different processes (such as a process of forming a protective film on the surface of the semiconductor layer, and removing the protective film from the diode region after forming the source trench). As a result, the semiconductor device can be manufactured at low cost.

Also, in the completed semiconductor device, in the reverse bias state, a depletion layer spreads around the second conductive type region for a diode at the bottom of the diode trench, and because the path of an electric current in the diode region is thereby blocked, the reverse leak current can be reduced.

In the seventeenth aspect of the present invention, the manufacturing method further includes: forming, before forming the source electrode and the schottky electrode, a first interlayer insulating film for insulating the gate electrode and the source electrode from each other at the same time as forming a second interlayer insulating film interposed between the schottky electrode and the surface of the first conductive type region for a diode outside of the diode trench.

With this method, in the completed semiconductor device, the gate electrode and the source electrode can be insulated from each other by the first interlayer insulating film, and the schottky electrode and the surface of the first conductive type region for a diode outside of the diode trench can be insulated from each other by the second interlayer insulating film. Because the first and second interlayer insulating films are formed in the same step, the number of manufacturing steps can be reduced.

In the eighteenth aspect of the present invention, a plurality of diode trenches are formed in the diode region with a gap therebetween, and the gap between the plurality of diode trenches is set such that a depletion layer spreading from each pn junction is connected to one another in the reverse bias state.

With this method, in the completed semiconductor device, in the reverse bias state, the depletion layers spread and are connected to each other at the bottom of adjacent diode trenches, which makes it possible to block the path of an electric current in the first conductive type region for a diode more reliably, and therefore, the reverse leak current can be reduced to a greater degree.

In the nineteenth aspect of the present invention, the source trench is formed at a surface of the semiconductor layer in a linear shape along a first direction, and the diode trench is formed at the surface of the semiconductor layer in a linear shape along a second direction that is orthogonal to the first direction.

With this configuration, by injecting impurity ions into the source trench and the diode trench at an angle relative to the second direction, to form the body contact region and the second conductive type region for a diode, the body contact region is formed at the side walls and the bottom of the source trench, and the second conductive type region for a diode is formed at the bottom of the diode trench. However, because the impurity ions are not injected into a pair of side walls of the diode trench facing each other along the first direction, the second conductive type region for a diode is not formed at the side walls. This allows the schottky electrode to form a schottky junction at the side walls of the diode trench.

In the twentieth aspect of the present invention, the source trench is formed in a linear shape at the surface of the semiconductor layer, the diode trench is formed to be rectangular in a plan view, and two parallel sides of the diode trench that is rectangular in a plan view are orthogonal to a lengthwise direction of the source trench.

With this method, by injecting impurity ions into the source trench and the diode trench at an angle relative to the direction orthogonal to the lengthwise direction of the source trench, to form the body contact region and the second conductive type region for a diode, the body contact region is formed at the side walls and the bottom of the source trench, and the second conductive type region for a diode is formed at the bottom of the diode trench. However, because the impurity ions are not injected to a pair of side walls of the diode trench facing each other along the direction orthogonal to the lengthwise direction of the diode trench, the second conductive type region for a diode is not formed at the side walls. This allows the schottky electrode to form a schottky junction at the side walls of the diode trench.

DETAILED DESCRIPTION OF THE PREFERRED EMBODIMENTS

Below, embodiments of the present invention will be explained in detail with reference to appended drawings.

Figure 1:
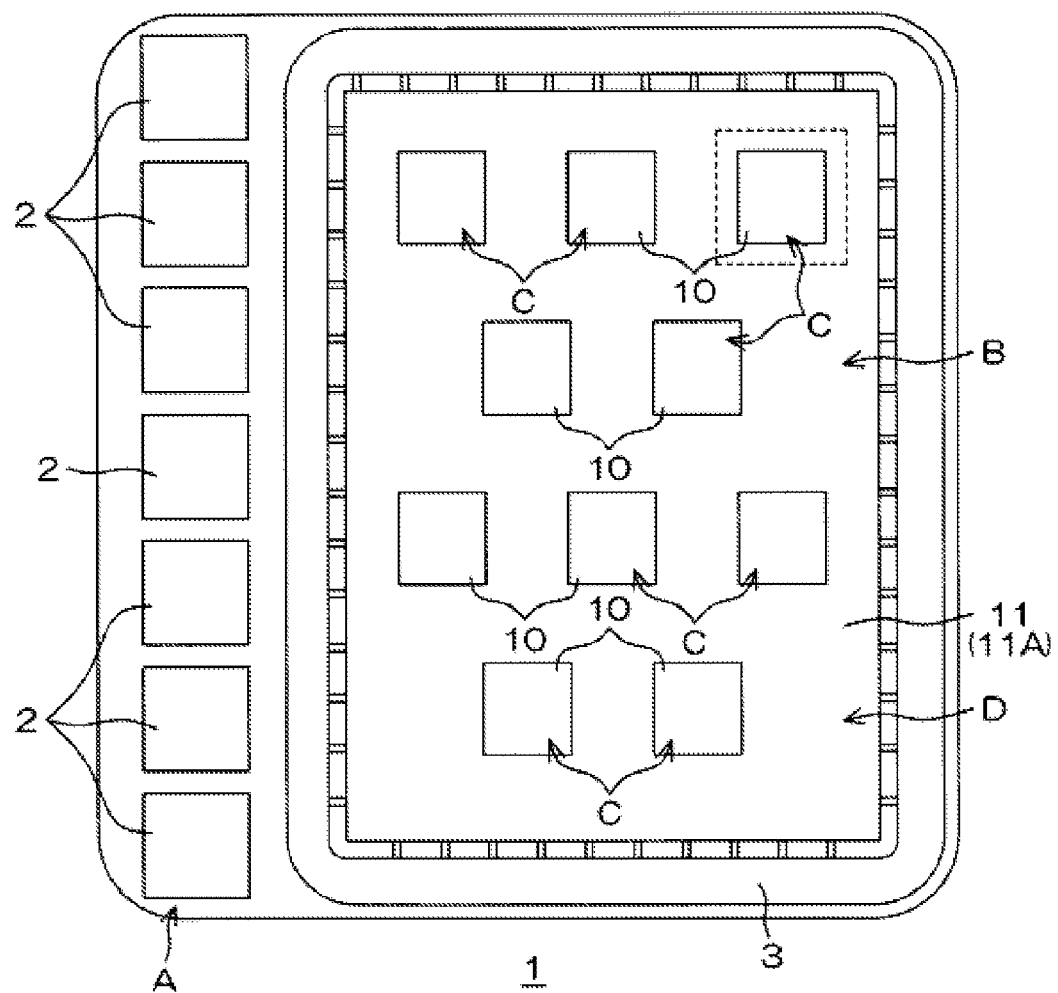
FIG. 1 is a schematic plan view of a semiconductor device of an embodiment of the present invention.
Figure 2:
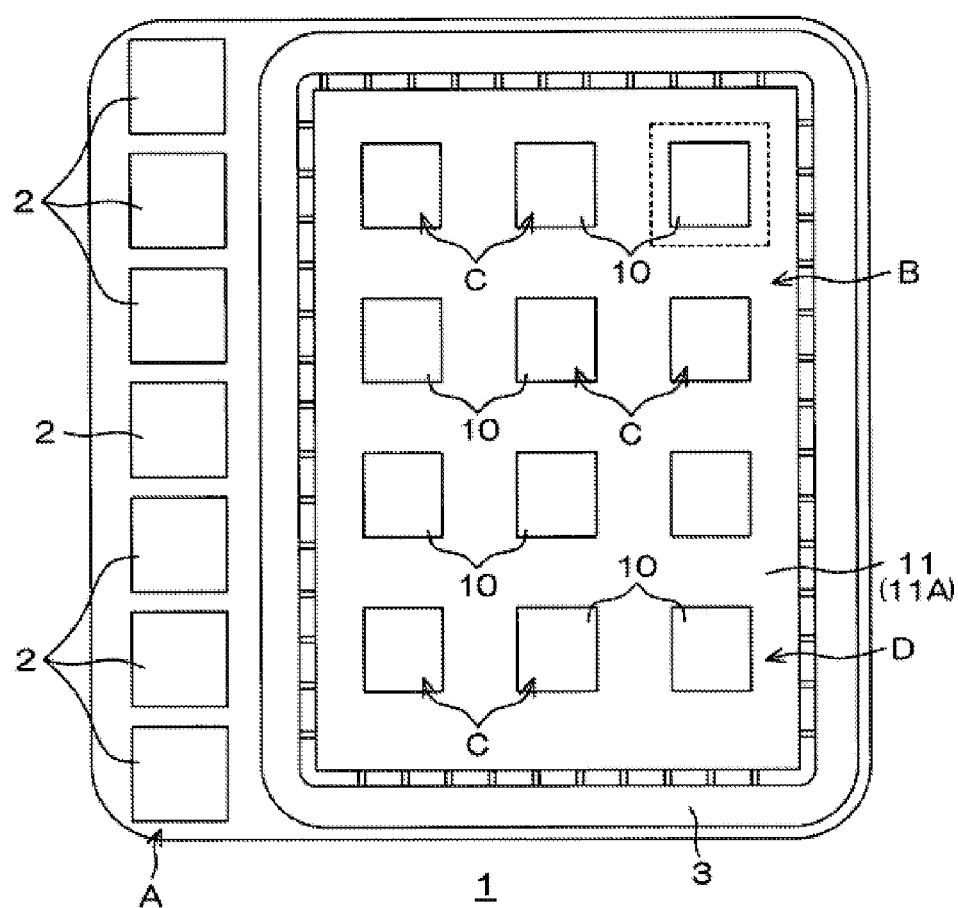
FIG. 2 is a schematic plan view of a semiconductor device of another embodiment of the present invention.

FIG. 1 is a schematic plan view of a semiconductor device of an embodiment of the present invention. FIG. 2 is a schematic plan view of a semiconductor device of another embodiment of the present invention.

A semiconductor device 1 of an embodiment of the present invention is formed to be a quadrangular chip in a plan view. The length of each of the four sides of the semiconductor device 1 in a plan view is approximately several mm, for example.

On the surface of the semiconductor device 1 having a quadrangular shape in a plan view, an external connection region A is formed along one side, and in a region other than the external connection region A, an active region B is formed. The semiconductor device 1 includes a plurality of external electrodes 2 disposed in the external connection region A, a guard ring 3 surrounding the active region B, a plurality of diode forming regions C disposed in the active region B, and a transistor forming region D defined as a region of the active region B where the diode forming regions C are not formed.

The plurality of (seven in this example) external electrodes 2 are disposed along one side of the quadrangle. Each external electrode 2 is connected to a lead (not shown) through a bonding wire (not shown) as described below. The guard ring 3 separates and insulates the external connection region A and the active region B from each other.

The plurality of diode forming regions C are dispersed so as to be distributed uniformly in the entire active region B. Specifically, the plurality of diode forming regions C may be arranged in a staggered pattern with a gap therebetween as shown in FIG. 1, or may be arranged in a matrix as shown in FIG. 2.

Figure 3:
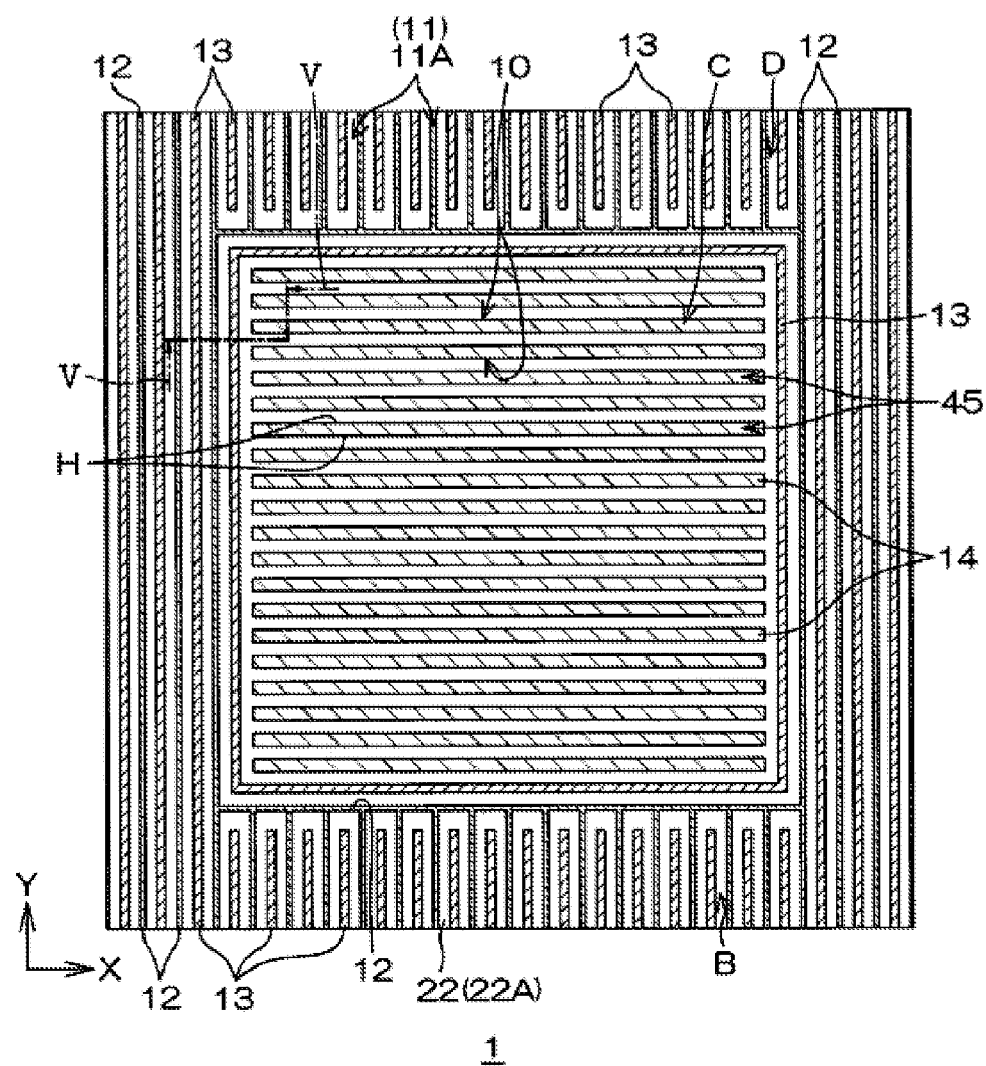
FIG. 3 is an enlarged view of a main part of the semiconductor device of FIG. 1 or 2.
Figure 4:
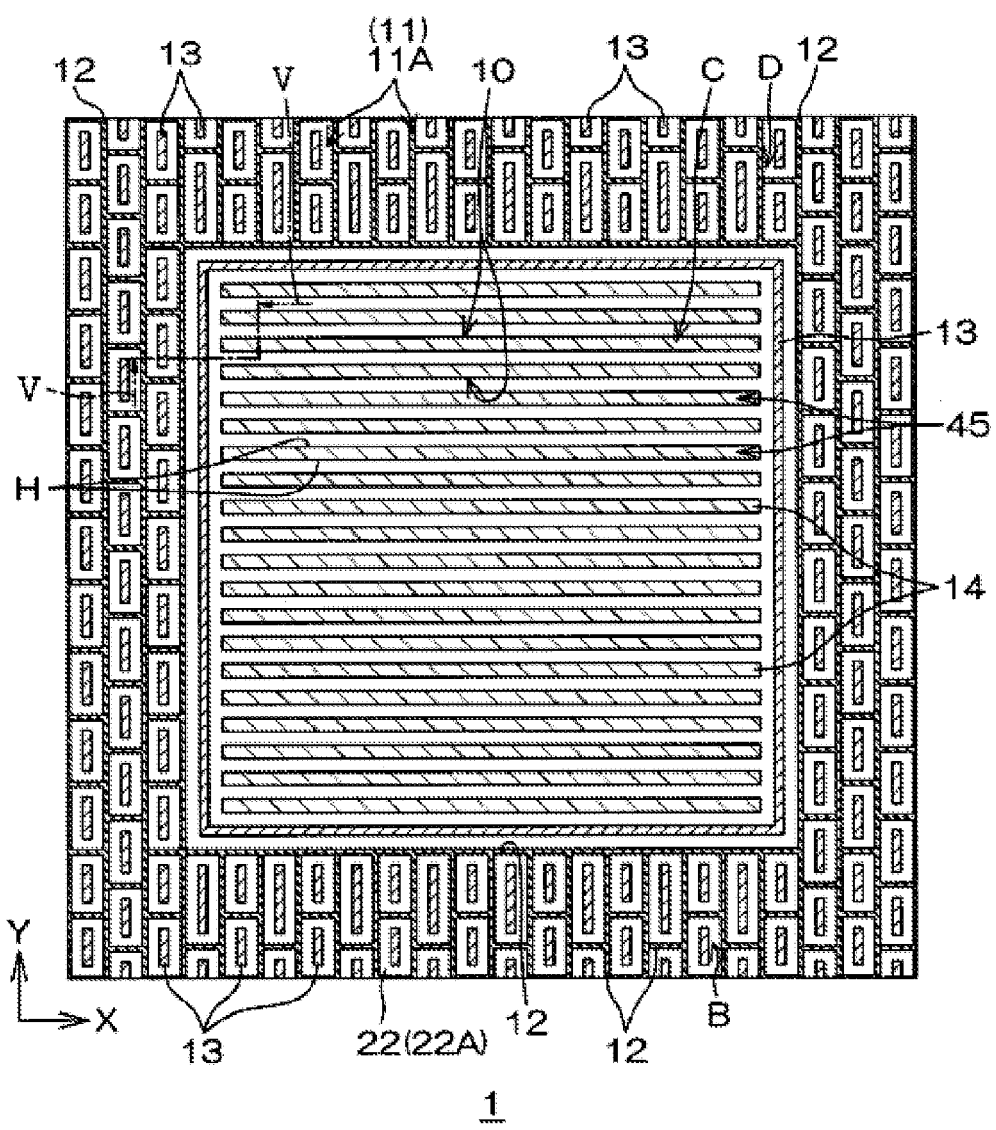
FIG. 4 is a diagram showing a modification example of a main part of the semiconductor device of FIG. 3.

FIG. 3 is an enlarged view of a main part of the semiconductor device of FIG. 1 or 2. FIG. 4 is a diagram showing a modification example of the main part of the semiconductor device of FIG. 3.

FIG. 3 shows a portion surrounded by a dotted line in FIG. 1 or 2 (one diode forming region C and the transistor forming region D therearound).

Each diode forming region C is in a square shape in a plan view. In a plan view, each diode forming region C is surrounded by the transistor forming region D.

In the diode forming region C, schottky barrier diodes 10 and pn diodes 45 are formed, and in the transistor forming region D, a plurality of transistor cells 11A are formed. The plurality of transistor cells 11A are connected in parallel, and form one transistor 11 altogether (see FIG. 1). The transistor 11 includes a plurality of schottky barrier diodes 10 and pn diodes 45 (see FIG. 1). As described above, in the active region B of the semiconductor device 1, the transistor 11 is formed surrounding the plurality of schottky barrier diodes 10 and pn diodes 45 (see FIG. 1). Accordingly, in the semiconductor device 1, the transistor 11, the schottky barrier diodes 10, and the pn diodes 45 are formed in the same element.

For the plurality of transistor cells 11A (transistor 11), gate trenches 12 and source trenches 13, which will be described later, are formed throughout substantially the entire surface of the semiconductor device 1 (to be more specific, a front surface 22A of a semiconductor layer 22 to be described later) in the transistor forming region D. The gate trenches 12 and the source trenches 13 are extended in a linear shape along the first direction Y in a plan view, and are alternately arranged side by side along the second direction X that is orthogonal to the first direction Y with a gap therebetween. That is, the gate trenches 12 and the source trenches 13 are formed in a stripe pattern.

Of the gate trench 12 and the source trench 13, the source trench 13 is formed nearest to the diode forming region C. The source trench 13 that is nearest to the diode forming region C is in a square ring shape that surrounds the entire diode forming region C. The gate trench 12 adjacent to the source trench 13 that is nearest to the diode forming region C is in a square ring shape that surrounds the entire source trench 13.

As shown in FIG. 4, the gate trenches 12 and the source trenches 13 may be arranged such that the gate trench 12 has a mesh-like pattern, thereby partitioning each of a plurality of rectangular regions, and in each of the rectangular regions, a source trench 13 is extended linearly so as not to touch the gate trench 12. In this case also, the source trench 13 that is nearest to the diode forming region C is in a square ring shape that surrounds the entire diode forming region C, and the gate trench 12 adjacent to this source trench 13 is in a square ring shape that surrounds the entire source trench 13.

For the schottky barrier diodes 10 and the pn diodes 45, diode trenches 14, which will be described later, are formed at the surface of the semiconductor device 1 in substantially the entire diode forming region C (to be more specific, the front surface 22A of the semiconductor layer 22, which will be described later). The diode trenches 14 extend linearly along the second direction X in a plan view, and are arranged side by side along the first direction Y with a gap therebetween. That is, in a plan view, each diode trench 14 is formed in a narrow rectangular shape longer in the second direction X, and a plurality of diode trenches 14 are formed in a stripe pattern. In each diode trench 14 that is rectangular in a plan view, two parallel sides (two sides extending in the second direction X) H are orthogonal to the lengthwise direction (first direction Y) of the source trench 13.

Figure 5:
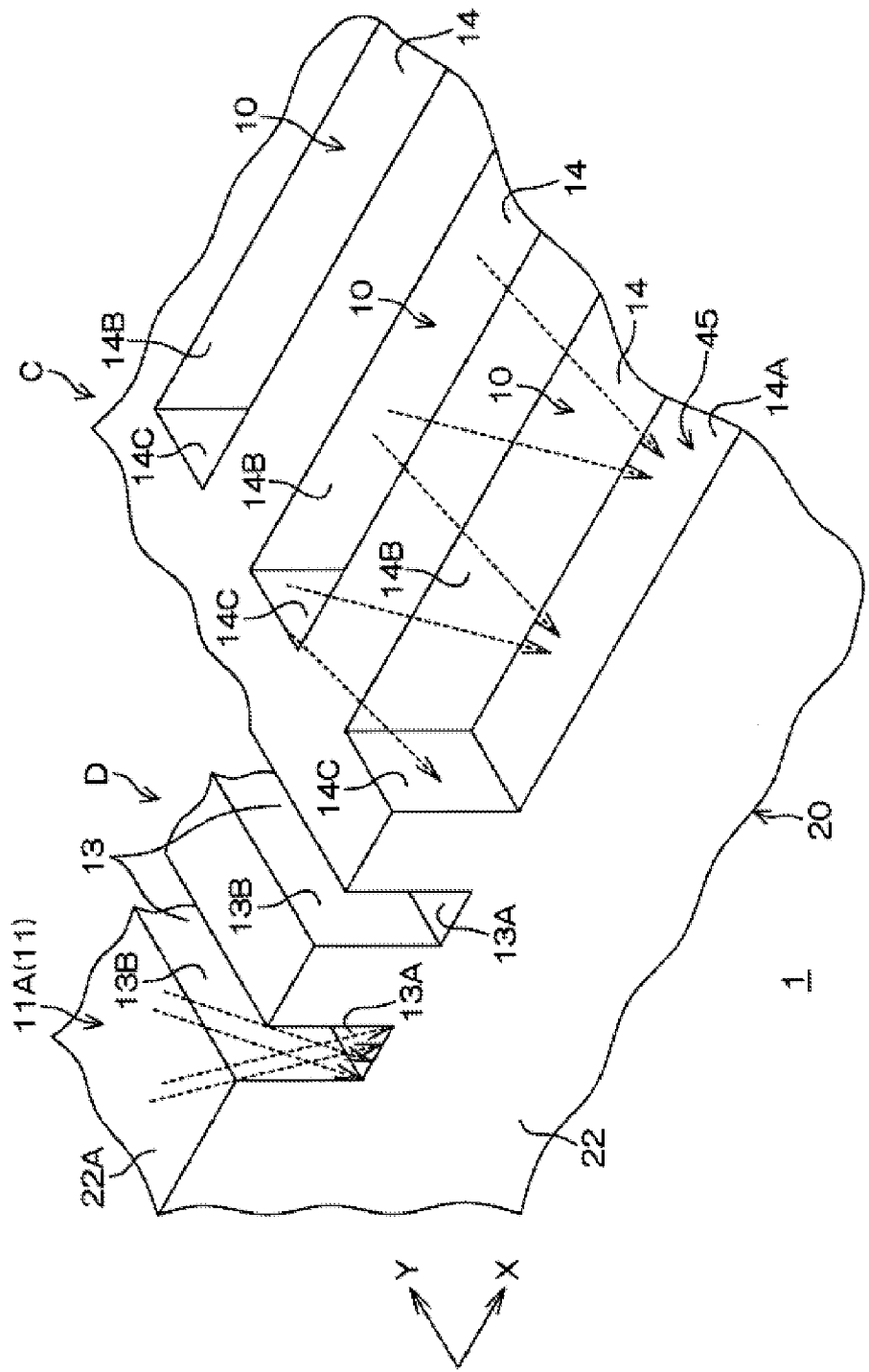
FIG. 5 is a perspective view near a cross section along the cut line V-V of FIG. 3 or 4.

FIG. 5 is a perspective view near a cross section along the cut line V-V of FIG. 3 or 4.

For ease of explanation, FIG. 5 shows the source trenches 13 and the diode trenches 14, but omits the gate trenches 12. As shown in FIG. 5, the source trenches 13 formed in a linear shape along the first direction Y and the diode trenches 14 formed in a linear shape along the second direction X extend orthogonally to each other.

Figure 6:
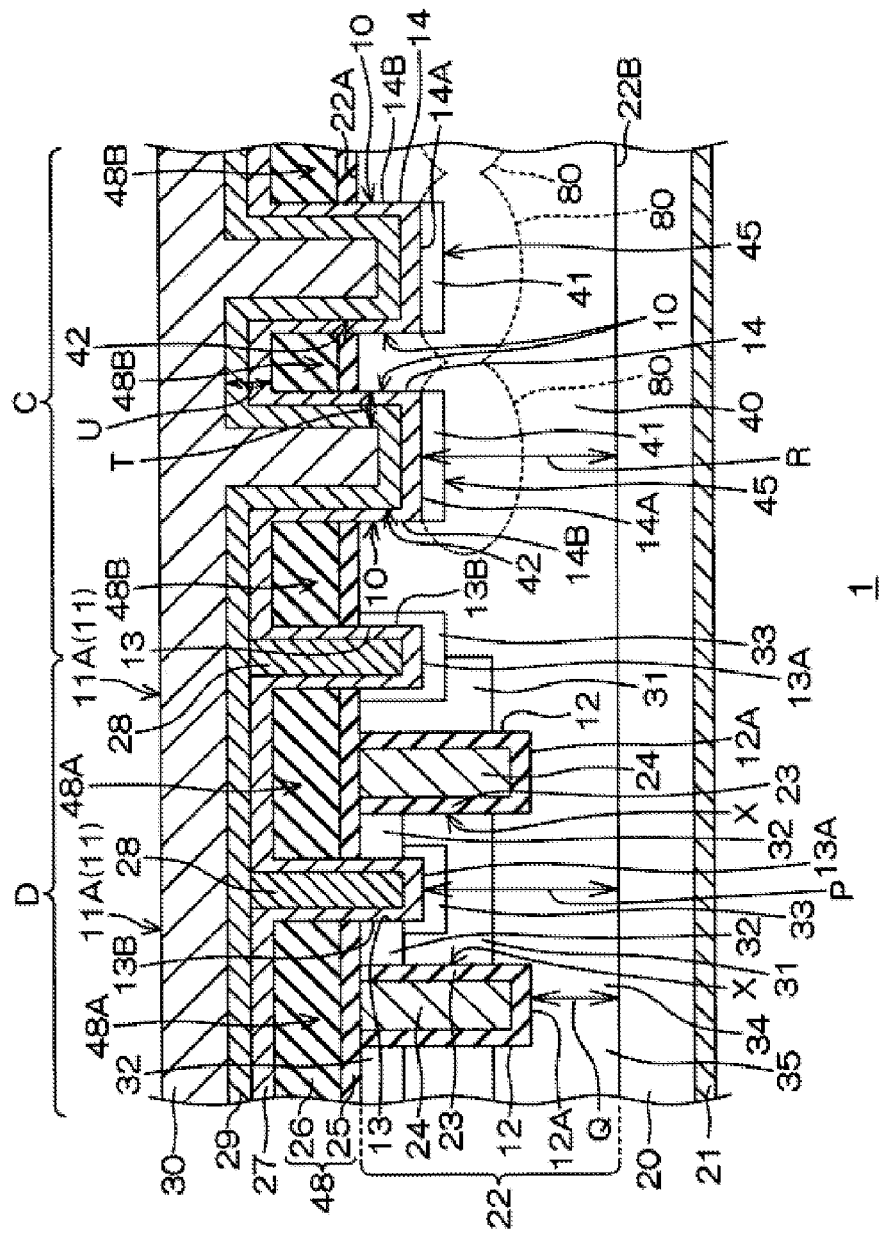
FIG. 6 is a cross-sectional view along the cut line V-V of FIG. 3 or 4.

FIG. 6 is a cross-sectional view along the cut line V-V of FIG. 3 or 4. Because the cut line V-V is bent at a right angle halfway (see FIGS. 3 and 4), two cross sections (cross section in the diode forming region C and cross section in the transistor forming region D) orthogonally intersect with each other in the actual device, but for ease of explanation, FIG. 6 shows the two cross sections along the same plane (the same is true for FIGS. 7A to 7J, and FIG. 8 below).

As shown in FIG. 6, the semiconductor device 1 includes a semiconductor substrate 20, a rear electrode 21, a semiconductor layer 22, a gate insulating film 23, gate electrodes 24, an oxide film 25, an insulating layer 26, a first metal film 27, a second metal film 29, source electrodes 28, and a conductive layer 30.

The semiconductor substrate 20 is made of an n$^+$ semiconductor (silicon, for example) with a prescribed concentration ($1 \times 10^{19}$ to $5 \times 10^{19}$ atom/cm$^3$, for example).

The rear electrode 21 covers the entire rear surface (lower surface in FIG. 6) of the semiconductor substrate 20. The rear electrode 21 is made of a metal (such as gold, nickel silicide, and cobalt silicide, for example) that forms an ohmic contact with n-type silicon. Therefore, the rear electrode 21 forms an ohmic contact with the rear surface of the semiconductor substrate 20.

The semiconductor layer 22 is formed on the front surface (upper surface in FIG. 6) of the semiconductor substrate 20. The semiconductor layer 22 is made of an n$^-$ semiconductor having a lower concentration than the semiconductor substrate 20 ($5 \times 10^{15}$ to $5 \times 10^{16}$ atom/cm$^3$, for example). In the semiconductor layer 22 of FIG. 6, the upper surface is referred to as a front surface 22A and the lower surface is referred to as a rear surface 22B. The thickness of the entire semiconductor layer 22 is 4 µm, for example. The semiconductor layer 22 and the semiconductor substrate 20 may be collectively regarded as a semiconductor layer.

In the semiconductor layer 22, the diode forming region C and the transistor forming region D are defined as described above. The semiconductor layer 22 in the transistor forming region D is referred to as a transistor region 35, and the semiconductor layer 22 in the diode forming region C is referred to as an n-type region 40 for a diode. FIG. 6 shows a part of the semiconductor layer 22 near the boundary between the diode forming region C and the transistor forming region D. The front surface 22A and the rear surface 22B of the semiconductor layer 22 are flat throughout the entire diode forming region C and the transistor forming region D, and extend parallel to each other.

In the entire surface portion of the semiconductor layer 22 in the transistor forming region D (transistor region 35), a p$^-$ body region 31 having a prescribed impurity concentration ($1 \times 10^{16}$ to $1 \times 10^{17}$ atom/cm$^3$, for example) is formed. A region of the transistor region 35 closer to the rear surface 22B than the body region 31 is an n$^-$ drain region 34. On the other hand, the semiconductor layer 22 in the diode forming region C is the abovementioned n-type region 40 for a diode, which is of an n$^-$ type. Near the surface of the body region 31, an n$^+$ source regions 32 having a prescribed impurity concentration ($5 \times 10^{19}$ to $5 \times 10^{20}$ atom/cm$^3$, for example) is selectively formed. Therefore, the body region 31 lies between the source region 32 and the drain region 34 along the thickness direction of the semiconductor layer 22. In other words, in the transistor region 35, the source region 32 and the drain region 34 are formed so as to be separated from each other across the body region 31 (along the thickness direction of the semiconductor layer 22). The surface of the source region 32 and the surface of the body region 31 in a region where the source region 32 is not formed are flush with each other, constituting the front surface 22A of the semiconductor layer 22 (transistor region 35) in the transistor forming region D. The thickness of the source region 32 is approximately 0.2 µm, for example, and the thickness of a portion of the body region 31 closer to the rear surface 22B than the source region 32 is approximately 0.4 µm, for example.

In the semiconductor layer 22 in the transistor forming region D, the above-mentioned gate trenches 12 are formed. Each gate trench 12 is recessed from the front surface 22A toward the rear surface 22B of the semiconductor layer 22 in the transistor forming region D. The gate trench 12 penetrates both the source region 32 and the body region 31, reaching the inside of the drain region 34. The bottom surface of the gate trench 12 is given the reference character 12A. The trench width of the gate trench 12 is approximately 0.2 µm, and the depth thereof is approximately 1 µm, for example.

The gate insulating film 23 is made of silicon oxide (SiO$_2$), and is formed so as to make contact with the entire inner surface (side wall surfaces and bottom wall surface) of each gate trench 12. The gate insulating film 23 makes contact with the body region 31 at the side wall surfaces of the gate trench 12, and makes contact with the drain region 34 at the bottom wall surface of the gate trench 12.

The gate electrode 24 is made of polysilicon, for example. The gate electrode 24 is embedded in the gate insulating film 23 in each gate trench 12. The gate electrode 24 faces surfaces (portions exposed in the gate trench 12) of the body region 31 (between the source region 32 and the drain region 34) and the drain region 34 through the gate insulating film 23.

The oxide film 25 is made of SiO$_2$, and covers substantially the entire front surface 22A of the semiconductor layer 22 in the transistor forming region D and the diode forming region C.

The insulating layer 26 is made of glass such as BPSG (boron phosphor silicate glass), and is formed on the oxide film 25. The layered oxide film 25 and insulating layer 26 constitute an interlayer insulating film 48. The thickness of the interlayer insulating film 48 is approximately 0.5 µm, for example. The interlayer insulating film 48 includes a first interlayer insulating film 48A formed in the transistor forming region D, and a second interlayer insulating film 48B formed in the diode forming region C. The first interlayer insulating film 48A and the second interlayer insulating film 48B have the same thickness.

The above-mentioned source trench 13 is recessed from the surface of the insulating layer 26 (upper surface in FIG. 6), and reaches the inside of the body region 31, penetrating the insulating layer 26, the oxide film 25 (first interlayer insulating film 48A), and the source region 32 in the semiconductor layer 22. The source trenches 13 are formed in positions other than where the gate trenches 12 are formed in the semiconductor layer 22 in the transistor forming region D, and are recessed from the front surface 22A of the semiconductor layer 22 in these positions. The trench width of the source trench 13 is approximately 0.2 μm, and the depth thereof is approximately 0.3 μm, for example. The distance P between the bottom surface 13A of the source trench 13 and the rear surface 22B of the semiconductor layer 22 is greater than the distance Q between the bottom surface 12A of the gate trench 12 and the rear surface 22B of the semiconductor layer 22. That is, the source trench 13 is formed shallower than the gate trench 12. In a plan view, an end of the body region 31 closer to the diode forming region C coincides with the center of the bottom surface 13A in the width direction of the source trench 13 that is closest to the diode forming region C (the rightmost source trench 13 in FIG. 6).

At the bottom surface 13A of the source trench 13 in the body region 31 and the periphery thereof (bottom portion of the source trench 13), a p$^+$ body contact region 33 is formed. The body contact region 33 has a higher impurity concentration ($5 \times 10^{18}$ to $5 \times 10^{19}$ atom/cm$^3$, for example) than that of the p$^-$ body region 31.

The above-mentioned diode trenches 14 are recessed from the front surface of the insulating layer 26 (upper surface in FIG. 6), and reaches the inside of the n-type region 40 for a diode in the semiconductor layer 22, penetrating the insulating layer 26 and the oxide film 25 (second interlayer insulating film 48B). As described above, the diode trench 14 is formed extending along the second direction X, and a plurality of diode trenches 14 are formed along the first direction Y with a gap therebetween in the n-type region 40 for a diode (see FIGS. 3 and 4). The distance R between the bottom surface 14A of each diode trench 14 and the rear surface 22B of the semiconductor layer 22 is the same as the distance P between the bottom surface 13A of the source trench 13 and the rear surface 22B of the semiconductor layer 22, and is greater than the distance Q between the bottom surface 12A of the gate trench 12 and the rear surface 22B of the semiconductor layer 22. That is, the source trench 13 and the diode trench 14 have the same depth, and are formed shallower than the gate trench 12.

At the bottom of the diode trench 14 (portion immediately below the bottom surface 14A) in the n-type region 40 for a diode, a p$^+$ region 41 for a diode, which is of a p$^+$ type and has substantially the same impurity concentration as that of the body contact region 33, is formed. The p$^+$ region 41 for a diode forms a pn junction with the n-type region 40 for a diode, which is of an n$^-$ type.

The first metal film 27 is made of a metal that forms a schottky junction by joining with n$^-$-type silicon. Examples of such a metal include titanium (Ti), molybdenum (Mo), palladium (Pd), titanium nitride (TiN), titanium silicide, molybdenum silicide, tungsten silicide, and cobalt silicide. These metals form a schottky junction with an n$^-$ semiconductor, and forms an ohmic junction with n$^+$ and p$^+$ semiconductors. The first metal film 27 is formed to make contact with the entire front surface of the first interlayer insulating film 48A (upper surface in FIG. 6) and the entire inner surfaces of each source trench 13, and in this state, the first metal film 27 is electrically connected to the source region 32 and the body contact region 33 (forming an ohmic contact). As described above, the source trenches 13 are formed to make contact with the source region 32 and the body contact region 33.

The first metal film 27 is also formed so as to make contact with the entire front surface of the second interlayer insulating film 48B (upper surface in FIG. 6) and the entire inner surfaces of each diode trench 14, and in this state, the first metal film 27 forms an ohmic contact with the p$^+$ region 41 for a diode, and forms a schottky junction with the n-type region 40 for a diode at side walls 14B of the diode trench 14.

The source electrodes 28 are made of tungsten, for example. The source electrode 28 is embedded in each source trench 13 so as to fill the inner space of the source trench 13 where the first metal film 27 is formed. The first metal film 27 in the source trench 13 functions as a part of the source electrode 28. The first interlayer insulating film 48A is formed covering the gate electrodes 24, and the source electrodes 28 are formed in the first interlayer insulating film 48A in positions where the gate electrodes 24 are not formed. This way, because the first interlayer insulating film 48A is interposed between a gate electrode 24 and a source electrode 28 adjacent to each other, the adjacent gate electrode 24 and source electrode 28 can be insulated from each other by the first interlayer insulating film 48A.

The second metal film 29 is made of titanium or titanium nitride, and covers the entire surface of the first metal film 27 and the surface of each source electrode 28 that is exposed from the source trench 13 (upper surface in FIG. 6). In the diode forming region C, the layered first metal film 27 and second metal film 29 constitute a schottky electrode 42. The schottky electrode 42 includes the first metal film 27 as a schottky/ohmic electrode layer that forms a schottky contact with the n-type region 40 for a diode at the side walls 14B of the diode trench 14 and that forms an ohmic contact with the p$^+$ region 41 for a diode at the bottom (around the bottom surface 14A) of the diode trench 14. The thickness of the schottky electrode 42 is 200 Å to 300 Å.

The front surface 22A of the semiconductor layer 22 in a portion of the diode region where the diode trenches 14 are not formed is entirely covered by the second interlayer insulating film 48B, and the front surface (upper surface in FIG. 6) and the side faces (constituting side walls 14B of the diode trench 14) of the second interlayer insulating film 48B are covered by the schottky electrode 42. That is, the second interlayer insulating film 48B is disposed (interposed) between the schottky electrode 42 and the surface (front surface 22A of the semiconductor layer 22) of the diode region outside of the diode trenches 14. By the second interlayer insulating film 48B, the schottky electrode 42 and the surface of the diode region outside of the diode trenches 14 are insulated from each other.

The conductive layer 30 is made of an alloy of aluminum and copper (AlCu alloy), for example. The conductive layer 30 is layered on the second metal film 29, and covers the entire surface (upper surface in FIG. 6) of the second metal film 29. The conductive layer 30 is electrically connected to corresponding electrodes out of the plurality of external electrodes 2 mentioned above (see FIGS. 1 and 2). The gate electrodes 24 are electrically connected to other corresponding external electrodes 2 via not-shown relay wiring lines.

In the transistor forming region D, the conductive layer 30, the second metal film 29, the source electrodes 28, the first metal film 27, the source region 32, and the body contact region 33 are electrically connected. The rear electrode 21, the semiconductor substrate 20, and the drain region 34 that is formed in a region of the semiconductor layer 22 closer to the semiconductor substrate 20 than the body region 31 are electrically connected.

This way, in the transistor forming region D, transistor cells 11A are constructed individually. The transistor cell 11A (transistor 11) has gate trenches 12 in which the gate electrodes 24 are embedded, and is therefore a so-called trench gate MOSFET (metal oxide semiconductor field effect transistor). In the transistor cell 11A, a parasitic diode is formed by the body region 31 and the drain region 34.

For example, in a state where the source electrodes 28 (conductive layer 30) are grounded and a positive voltage is applied to the rear electrode 21, a voltage equal to or greater than a threshold voltage is applied to the gate electrodes 24. As a result, a channel is formed in a channel region X near the boundary between the body region 31 and the gate insulating film 23 outside of the gate electrodes 24, allowing an electric current to flow toward the source electrode 28 from the rear electrode 21 via the channel.

In the diode forming region C, the rear electrode 21 forms an ohmic contact with the semiconductor substrate 20, and the first metal film 27 (schottky electrode 42) forms a schottky junction with the n-type region 40 for a diode at the side walls 14B of the diode trench 14, thereby constituting a schottky barrier diode 10. The schottky barrier diode 10 and the transistor 11 are connected to each other in parallel. Also, the p+ region 41 for a diode at the bottom surface 14A of each diode trench 14 forms a pn junction with the n-type region 40 for a diode in the diode forming region C, and with the pn junction between the p+ region 41 for a diode and the n-type region 40 for a diode, a pn diode 45 is constituted. As described above, in one diode trench 14, the pn diode 45 is formed at the bottom surface 14A, and the schottky barrier diode 10 is formed at the side walls 14B.

In each diode trench 14 in the diode forming region C, the schottky barrier diode 10 and the pn diode 45 are connected to each other in parallel. The forward voltage (Vf) of the schottky barrier diode 10 is lower than Vf of the pn diode 45 (0.6V to 0.7V, for example), and therefore, an electric current flows through the schottky barrier diode 10 before the pn diode 45.

In a reverse bias state, a depletion layer 80 spreads from the pn diode 45 at the bottom of each diode trench 14, and respective depletion layers 80 at the bottom of adjacent diode trenches 14 are connected to each other. In other words, the gap between the plurality of diode trenches 14 is set such that the depletion layers 80 each spreading from the pn junction between the p+ region 41 for a diode and the n-type region for a diode are connected to each other in the reverse bias state. By the depletion layers 80 spreading and connecting to each other near the pn diodes 45 at the bottom of the diode trenches 14, the path of an electric current in the diode forming region is blocked, thereby making it possible to reduce the reverse leak current.

The second interlayer insulating film 48B does not have to be formed, and it is also possible to omit the second insulating film 48B so as to increase the area of the schottky junction between the schottky electrode 42 and the n-type region for a diode. However, the thickness of the schottky electrode 42 on the surface (front surface 22A) of the n-type region for a diode, and the thickness of the schottky electrode 42 at the side walls 14B of the diode trench 14 do not necessarily become equal to each other, possibly causing the characteristics to be unstable. In other words, if the thickness of a portion of the schottky electrode 42 that forms a schottky junction with the n-type region for a diode differs depending on places, a plurality of schottky barrier diodes 10 having slightly different forward voltages (Vf) are connected in parallel, which can cause the characteristics of the entire schottky barrier diodes 10 to be unstable.

In order to address this problem, in the semiconductor device 1 of the present embodiment, the second interlayer insulating film 48B is left, instead of being removed. In this case, the schottky electrode 42 has a first thickness T at the side walls 14B of the diode trench 14, and has a second thickness U that is greater than the first thickness T on the second interlayer insulating film 48B.

In the semiconductor device 1, only the portion of the schottky electrode 42 having the first thickness T forms a schottky junction with the n-type region for a diode at the side walls 14B of the diode trench 14, and the portion of the schottky electrode 42 with the second thickness U does not form a schottky junction with the n-type region for a diode. As a result, the portion of the schottky electrode 42 that forms the schottky junction with the n-type region for a diode has a uniform thickness, i.e., the first thickness T, and because the variation in Vf can be eliminated, the overall characteristics of the schottky barrier diode 10 can be made stable. This makes it possible to improve the overall performance of the semiconductor device 1. Also, because it is possible to omit the step of removing the second interlayer insulating film 48B in manufacturing the semiconductor device 1, the number of manufacturing steps can be reduced, thereby reducing the cost.

FIGS. 7A to 7J are illustrative cross-sectional views showing a manufacturing method of the semiconductor device of FIG. 6.

Figure 7A:
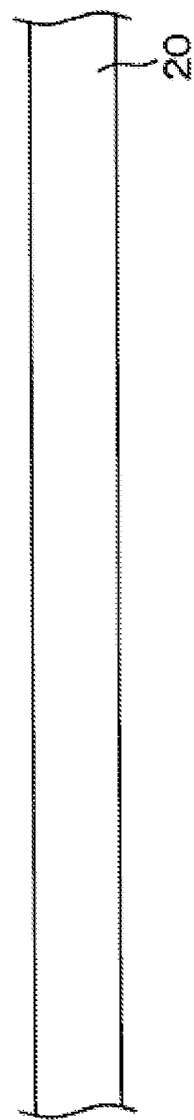
FIG. 7A is an illustrative cross-sectional view showing a manufacturing method of the semiconductor device of FIG. 6.

First, as shown in FIG. 7A, the semiconductor substrate 20 is made by a known method.

Figure 7B:
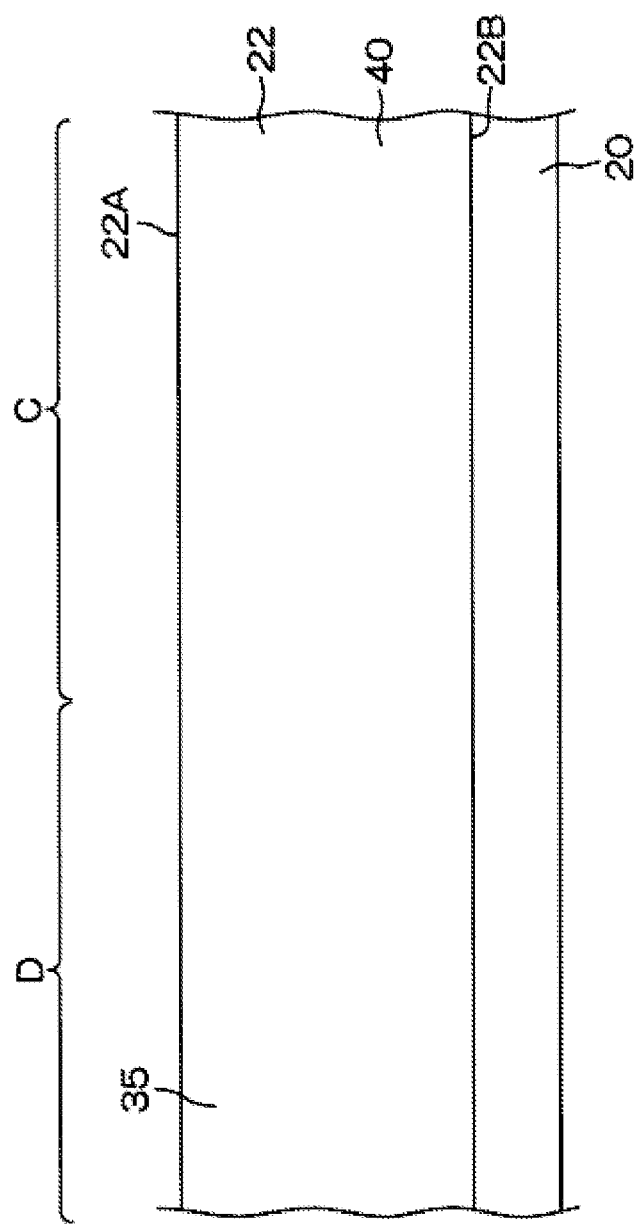
FIG. 7B is an illustrative cross-sectional view showing a step that follows FIG. 7A.

Next, as shown in FIG. 7B, on the semiconductor substrate 20, the semiconductor layer 22 of an n⁻-type is formed through the epitaxial growth on the surface of the semiconductor substrate 20. In the semiconductor layer 22, a transistor region 35 corresponding to the transistor forming region D, and an n-type region 40 for a diode corresponding to the diode forming region C are defined.

Figure 7C:
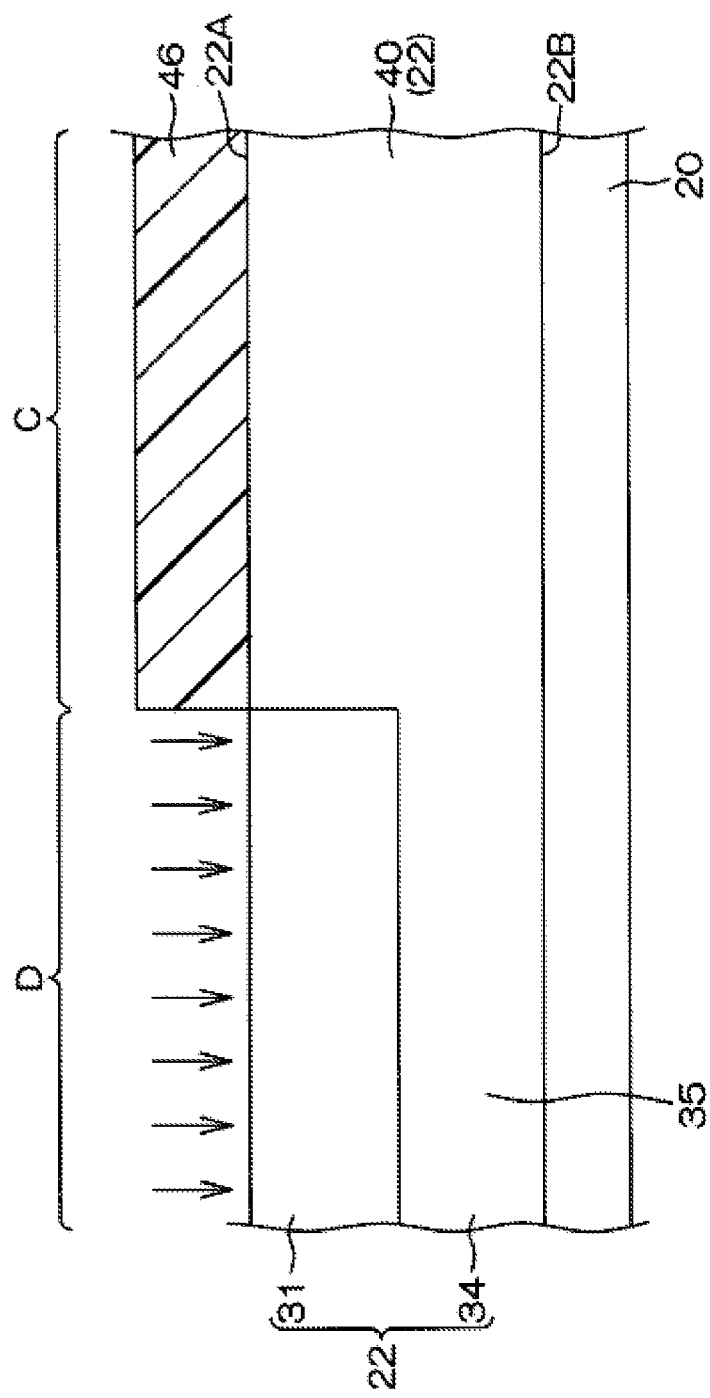
FIG. 7C is an illustrative cross-sectional view showing a step that follows FIG. 7B.

Next, as shown in FIG. 7C, a resist pattern 46 covering the diode forming region C and exposing only the transistor forming region D (transistor region 35) is formed on the semiconductor layer 22. Next, a p-type impurity (boron, for example) is injected into a surface portion of the semiconductor layer 22 in the transistor forming region D (transistor region 35). Thereafter, the resist pattern 46 is removed, and by conducting annealing, the p-type impurity is activated. As a result, as shown in FIG. 7C, the p⁻ body region 31 is formed in the surface portion of the transistor region 35. On the other hand, the n⁻ type diode forming region remains intact. In the semiconductor layer 22 in the transistor forming region D, a portion closer to the semiconductor substrate 20 than the body region 31 is the drain region 34.

Figure 7D:
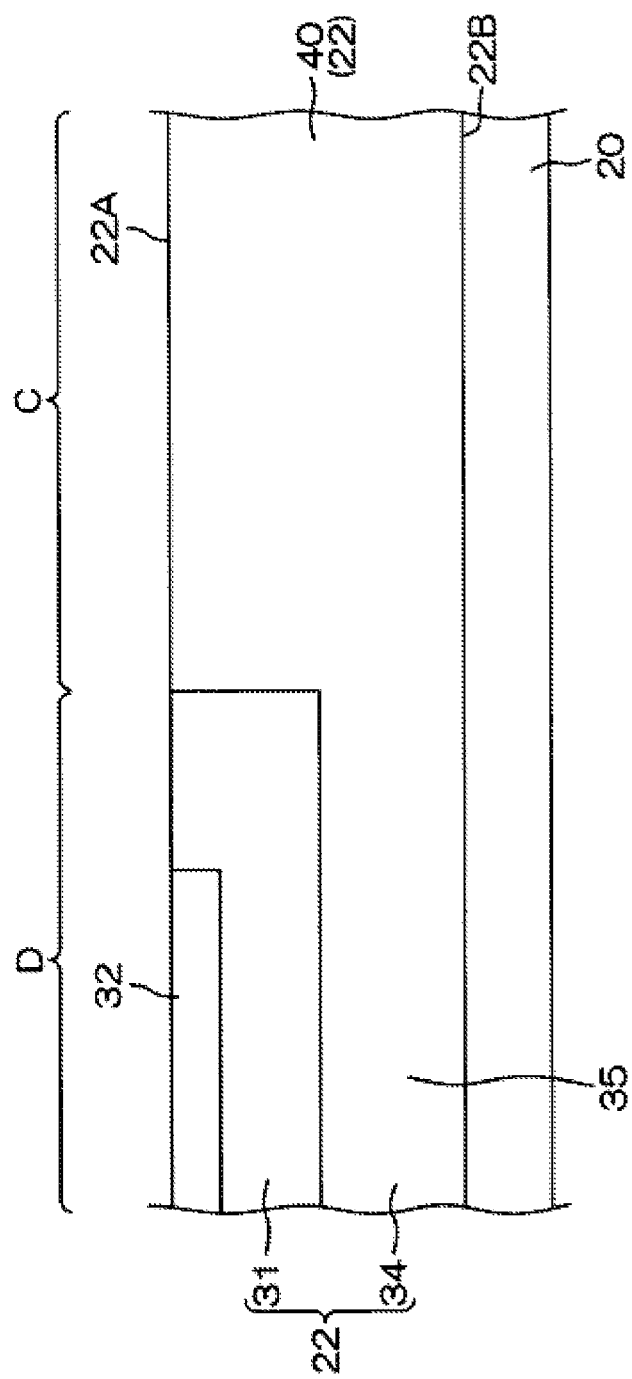
FIG. 7D is an illustrative cross-sectional view showing a step that follows FIG. 7C.

Next, in the surface portion of the body region 31, n-type impurity ions (arsenic or phosphorus, for example) are selectively injected. Thereafter, by conducting annealing, the n-type impurity is activated, and as shown in FIG. 7D, the source region 32 is formed in the surface portion of the body region 31.

Figure 7E:
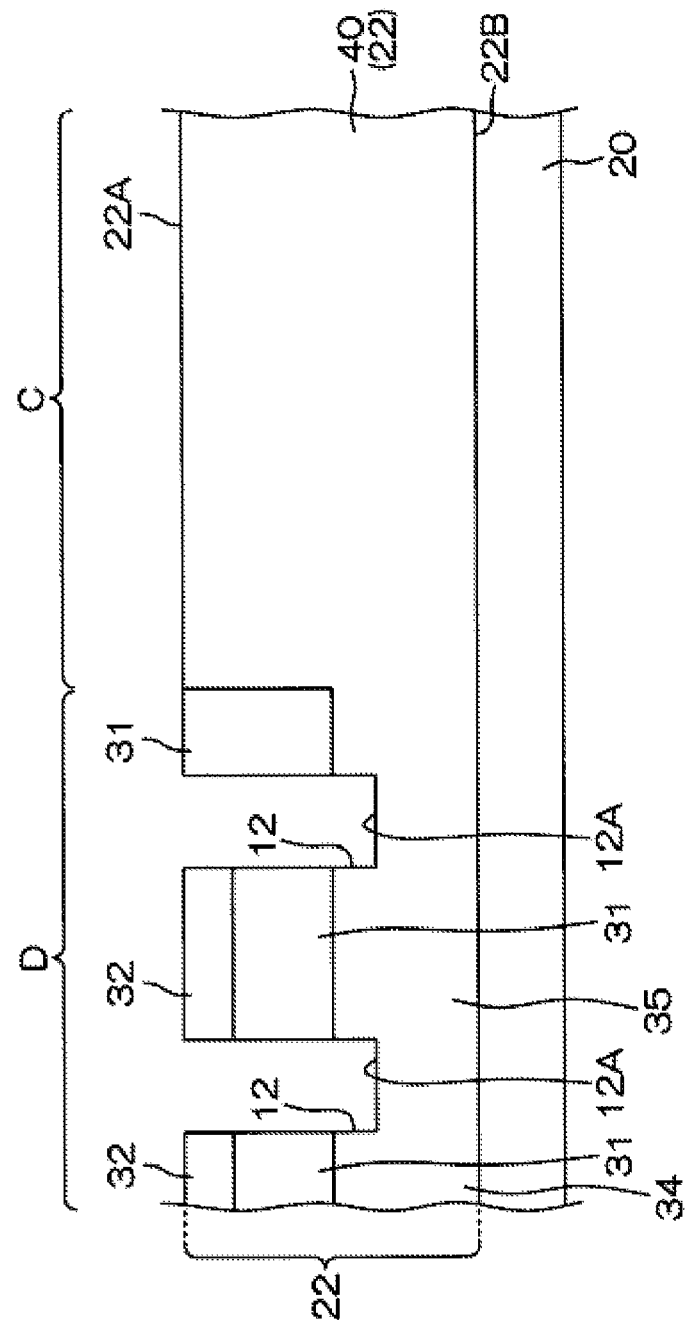
FIG. 7E is an illustrative cross-sectional view showing a step that follows FIG. 7D.

Next, through etching that uses a resist pattern (not shown) as a mask, recesses are formed in the semiconductor layer 22 from the front surface 22A. As a result, as shown in FIG. 7E, gate trenches 12 are formed in the semiconductor layer 22 in the transistor forming region D.

Figure 7F:
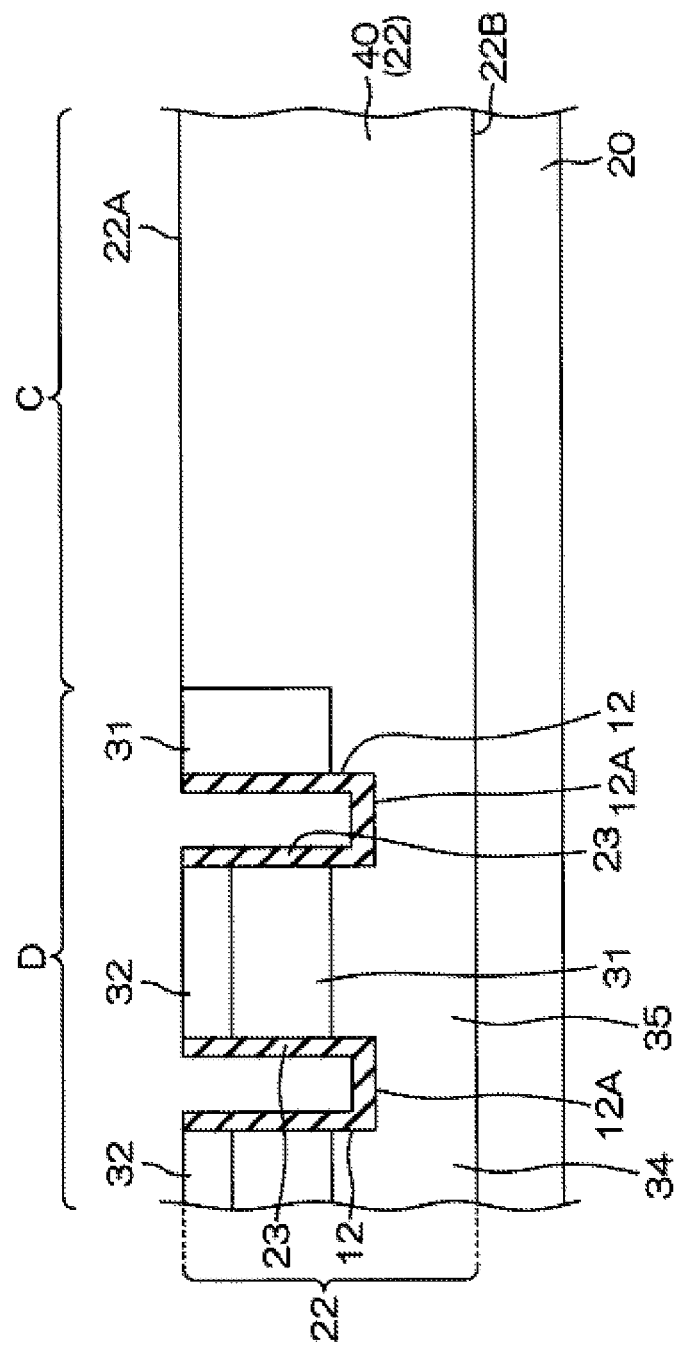
FIG. 7F is an illustrative cross-sectional view showing a step that follows FIG. 7E.

Next, by the CVD (chemical vapor deposition) method, as shown in FIG. 7F, the gate insulating film 23 made of SiO$_2$ is formed to cover the entire inner surfaces of the gate trenches 12.

Figure 7G:
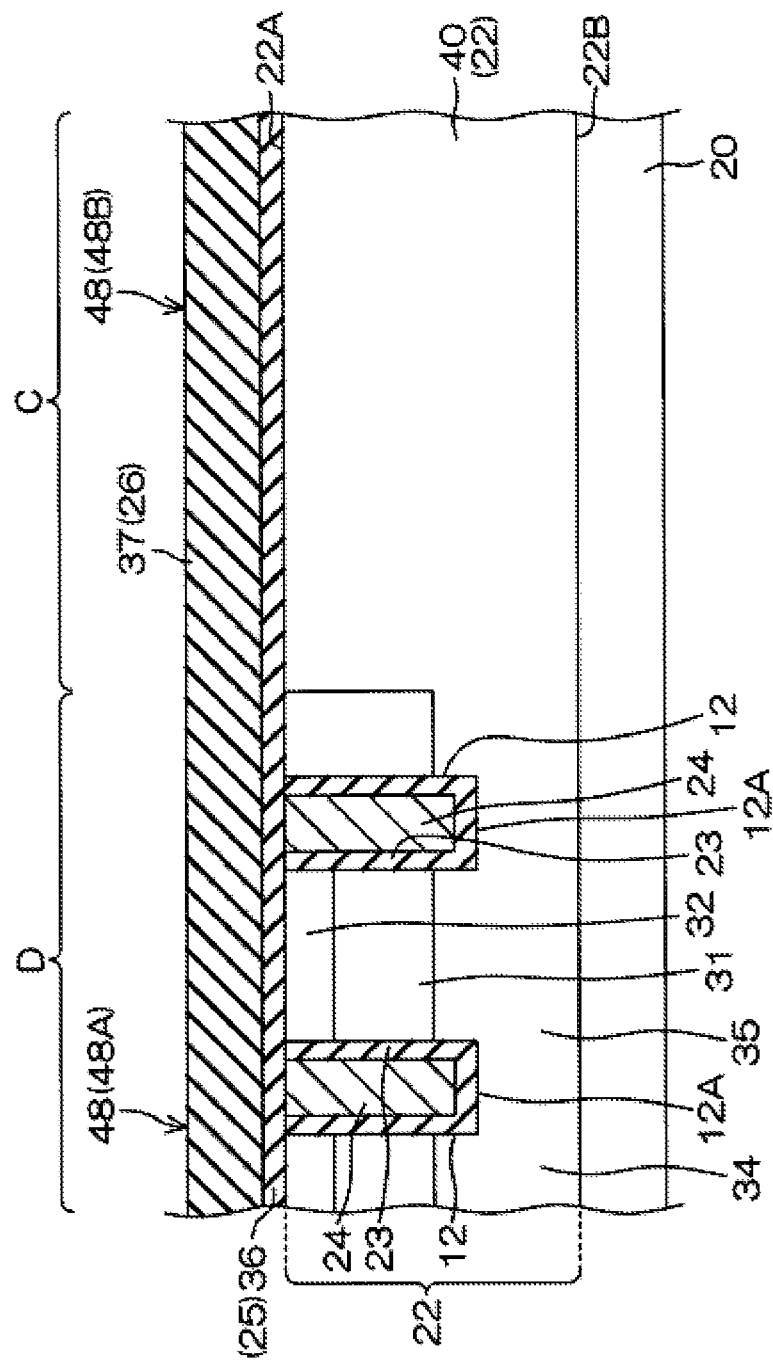
FIG. 7G is an illustrative cross-sectional view showing a step that follows FIG. 7F.

Next, as shown in FIG. 7G, a gate electrode 24 made of polysilicon is embedded inside of the gate insulating film 23 in each gate trench 12.

Next, by the CVD method, for example, a film made of SiO$_2$ (SiO$_2$ film) 36 is formed on the entire front surface 22A of the semiconductor layer 22 in both the diode forming region C and the transistor forming region D. The SiO$_2$ film 36 becomes the oxide film 25.

Next, by conducting CVD in high density, a layer made of glass such as BPSG (glass layer) 37 is formed on the SiO$_2$ film 36. FIG. 7G shows a state immediately after the glass layer 37 is formed. The glass layer 37 becomes the insulating layer 26. By forming the glass layer 37 on the SiO$_2$ film 36 in this manner, the above-mentioned interlayer insulating film 48 is formed.

Figure 7H:
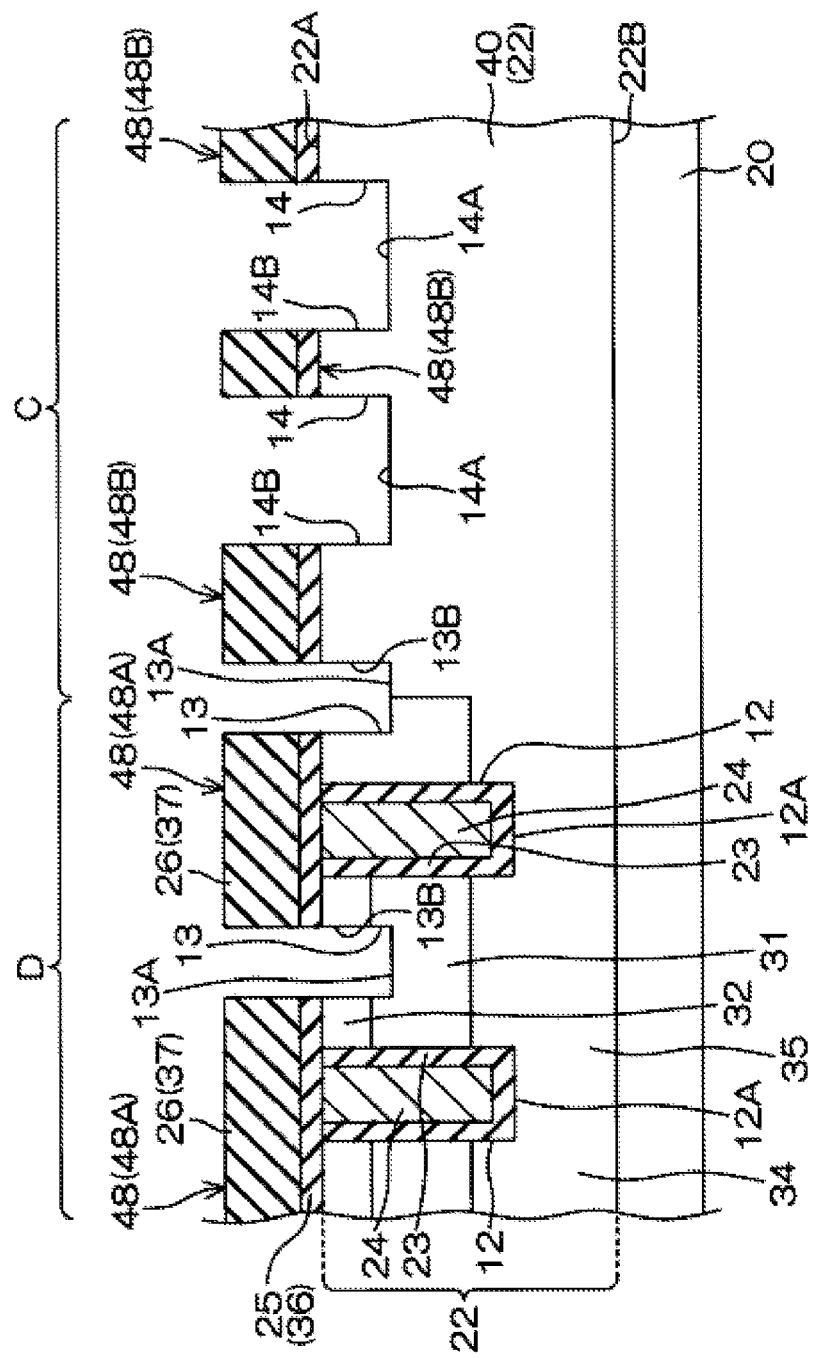
FIG. 7H is an illustrative cross-sectional view showing a step that follows FIG. 7G.

Next, by conducting etching that uses a resist pattern (not shown) as a mask, the glass layer 37, the SiO$_2$ layer 36, and the semiconductor layer 22 are etched in this order in the diode forming region C and the transistor forming region D, thereby forming recesses. In this way, as shown in FIG. 7H, a plurality of diode trenches 14 are formed in the diode forming region C, and at the same time, a plurality of source trenches 13 are formed in the transistor forming region D. The bottom surface 14A of each diode trench 14 and the bottom surface 13A of each source trench 13 are located at the same position in terms of the depth direction of the semiconductor layer 22, and are at the same level. Because the diode trenches 14 and the source trenches 13 are formed in the same process (that is, with the same conditions), the diode trenches 14 and the source trenches 13 have the same depth.

Figure 7I:
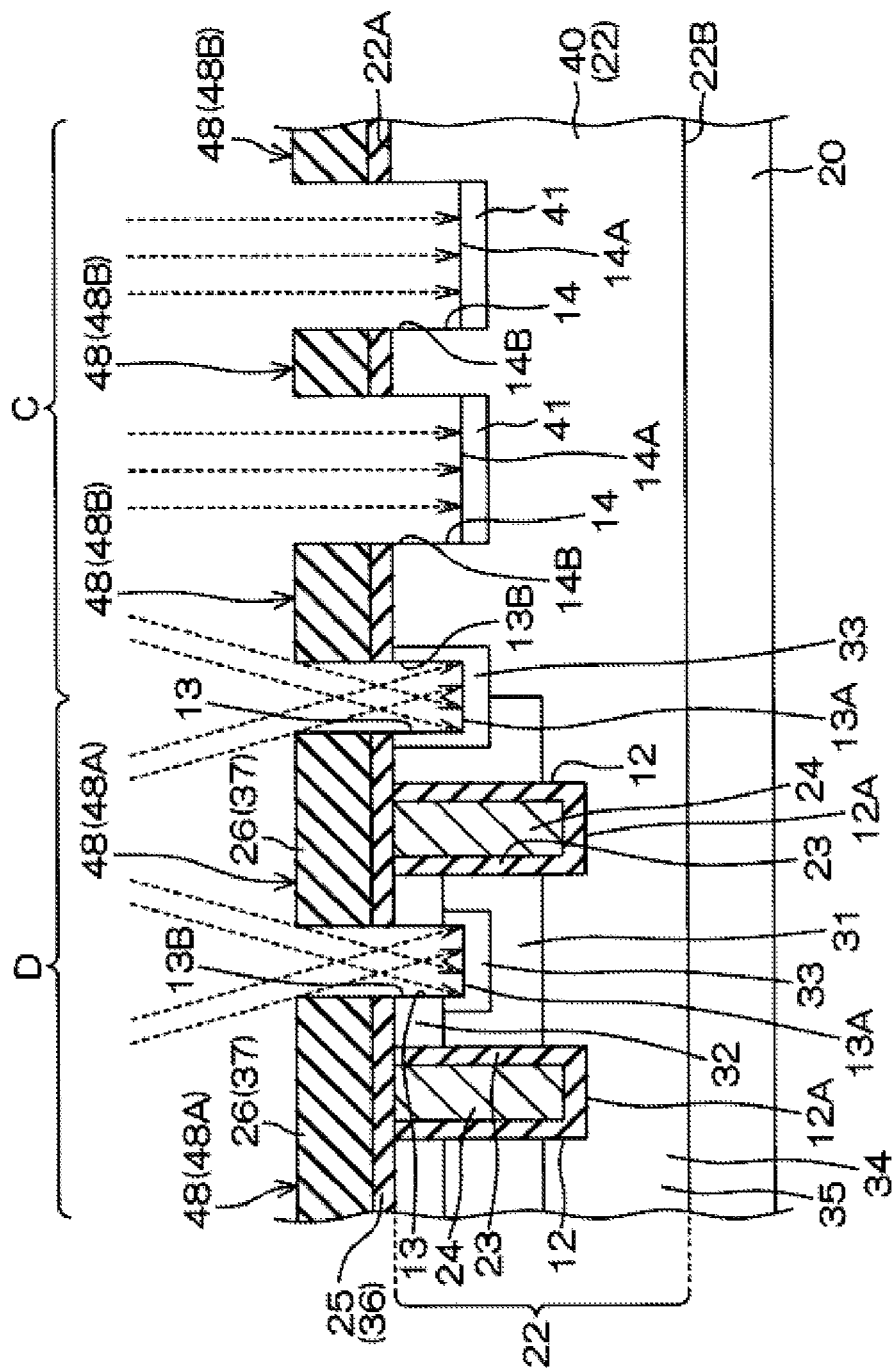
FIG. 7I is an illustrative cross-sectional view showing a step that follows FIG. 7H.

Next, as shown in FIG. 7I, p-type impurity ions (boron, for example) are selectively injected into the surface portions of the semiconductor layer 22 through the bottom of each source trench 13 (bottom surface 13A and the periphery thereof) and the bottom of each diode trench 14 (bottom surface 14A and the periphery thereof). As indicated with the broken lines in FIG. 5, the impurity ions are injected toward the respective bottom portions of the source trenches 13 and the diode trenches 14 at a prescribed angle (approximately ±7°, for example) relative to the thickness direction of the semiconductor substrate 20 (in a direction inclined along the second direction X) in the plane along the second direction X (direction orthogonal to the lengthwise direction of the source trench 13).

Therefore, as in FIG. 7I, when respective cross sections of the source trenches 13 and the diode trenches 14 along the respective widthwise directions are shown on the same plane, the impurity ions are injected to the source trenches 13 along the direction that is inclined relative to the depth direction, and the impurity ions are injected to the diode trenches 14 along the depth direction as indicated with the broken arrows. As a result, in each source trench 13 in the semiconductor layer 22, the impurity ions are injected into the bottom surface 13A and a pair of side walls 13B facing along the widthwise direction (the above-mentioned second direction X). In each diode trench 14 in the semiconductor layer 22, while the impurity ions are injected into the bottom surface 14A and a pair of side walls 14C (see FIG. 5) facing along the lengthwise direction (the above-mentioned second direction X), almost no impurity ions are injected into a pair of side walls 14B facing along the widthwise direction (the above-mentioned first direction Y).

Thereafter, by conducting annealing, the p-type impurity (ions injected in the previous step) is activated, forming the body contact region 33 in the body region 31 at the side walls 13B and the bottom of each source trench 13 and, at the same time, forming the p$^+$ region 41 for a diode at the bottom of each diode trench 14 in the n-type region 40 for a diode. The p$^+$ region 41 for a diode is formed in a portion immediately below the bottom surface 14A of the diode trench 14 and at the side walls 14C of the diode trench 14 (see FIG. 5). However, at the pair of side walls 14B (facing along the above-mentioned first direction Y) of the diode trench 14, the impurity ion injection was suppressed as described above, and therefore, the p$^+$ region 41 for the diode is not formed. This allows the schottky electrode 42 to form a schottky junction at the side walls 14B of the diode trench 14 as described below.

Figure 7J:
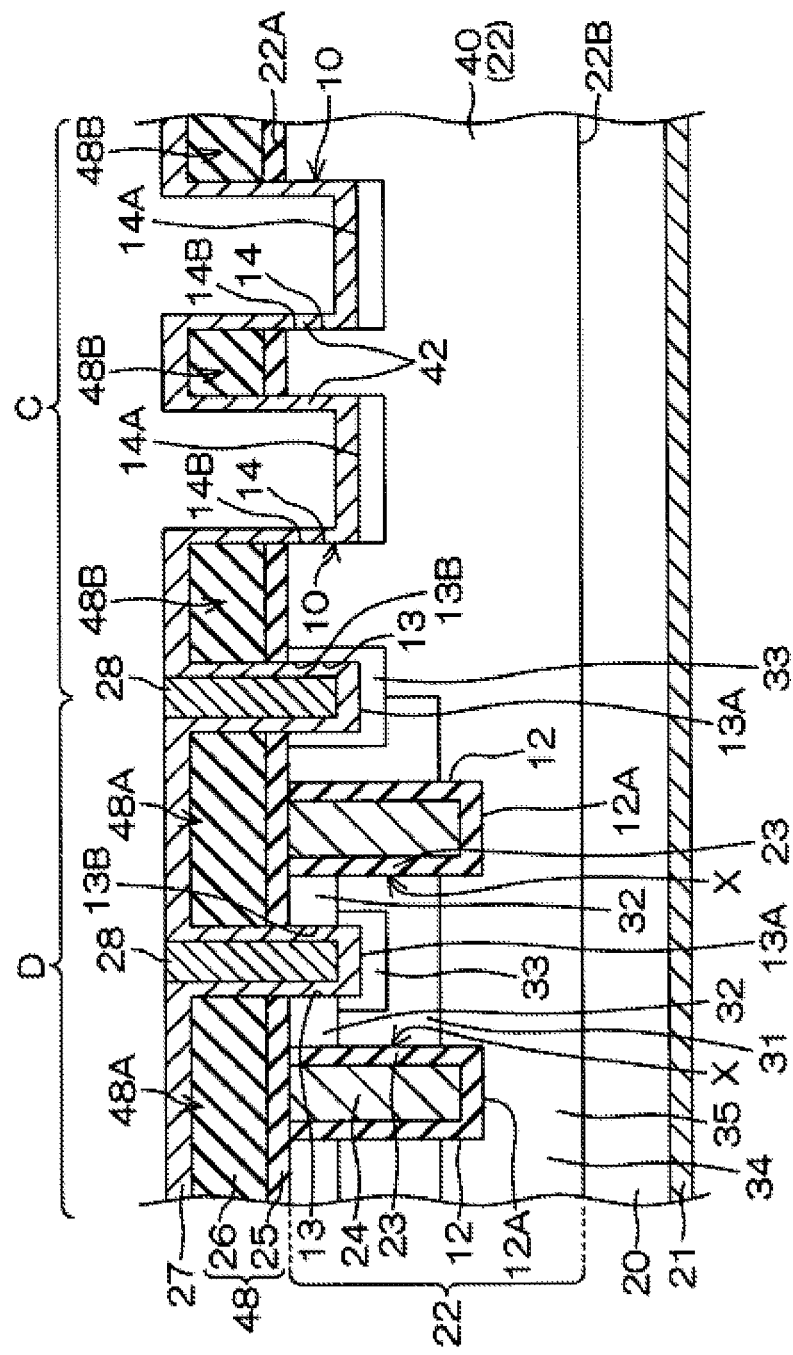
FIG. 7J is an illustrative cross-sectional view showing a step that follows FIG. 7I.

Next, as shown in FIG. 7J, by sputtering or the like, the first metal film 27 made of titanium is formed on the entire inner surfaces of the source trenches 13 and the diode trenches 14 (portions of the oxide film 25, the insulating layer 26, and the semiconductor layer 22 that are exposed in each trench) and the entire surface of the insulating layer 26 (interlayer insulating film 48).

Next, a source electrode 28 made of tungsten is embedded inside of the first metal film 27 in each source trench 13. FIG. 7J shows a state immediately after the source electrodes 28 are embedded.

Next, by sputtering or the like, the second metal film 29 made of titanium is formed on the entire surface of the first metal film 27 and the surface of each source electrode 28 that is exposed from the source trench 13, and thereafter, the conductive layer 30 made of aluminum is formed on the second metal film 29. Next, by forming the rear electrode 21 on the rear surface of the semiconductor substrate 20, as shown in FIG. 6, each transistor cell 11A (transistor 11), schottky barrier diode 10, and pn diode 45 are completed at the same time, thereby completing the semiconductor device 1.

The source electrodes 28 (including the first metal film 27 in the source trenches 13) and the schottky electrode 42 (constituted of the first metal film 27 and the second metal film 29) may be made of the same electrode material (specifically the material of the first metal film 27). In this case, the schottky electrode 42 is formed at the same time as embedding the source electrode 28 in each source trench 13. That is, by supplying the electrode material into each source trench 13 and each diode trench 14, the source electrodes 28 and the schottky electrode 42 can be formed in the same process. Also, by forming the schottky electrode 42 (especially the first metal film 27) at the side walls 14B and the bottom (bottom surface 14A) of each diode trench 14, the schottky barrier diode 10 and the pn diode 45 can be formed at the same time.

The schottky electrode 42 (first metal film 27 and second metal film 29) is formed by sputtering or the like in which it is harder for a metal material (titanium as described above) to be deposited on the side walls 14B of each diode trench 14, and therefore, the thickness thereof becomes greater on the bottom surfaces 14A and on the second interlayer insulating film 48B than on the side walls 14B.

As described above, in the semiconductor device 1, the transistor 11 is formed in the transistor region 35, which is a region of the semiconductor layer 22 outside of the diode forming region, and in the diode forming region, the pn diode 45 is formed at the bottom of each diode trench 14, and the schottky barrier diode 10 is formed at the side walls 14B of each diode trench 14. In this case, the source trenches 13 and the diode trenches 14 can be formed at the same time (see FIG. 7H). Also, it is possible to form the body contact region 33 at the bottom of each source trench 13 at the same time as forming the p$^+$ region 41 for a diode at the bottom of each diode trench 14 (see FIG. 7I). Furthermore, it is possible to embed the source electrode 28 in each source trench 13 at the same time as forming the schottky electrode 42 in each diode trench 14 (see FIG. 7J). As a result, the transistor 11 and the diodes (schottky barrier diodes 10 and pn diodes 45) can be formed at the same time. Thus, it is possible to omit the process that would be necessary when the transistor 11 and the diodes were formed in different processes (such as a process of forming a protective film on the surface of the semiconductor layer 22, and thereafter removing the protective film from the diode region after the source trenches 13 are formed). As described above, the diode trenches 14 and the p$^+$ region 41 for a diode can be formed by using the process for forming the transistor 11 (that is, a special process for forming the diodes is no longer needed), and therefore, it is possible to fabricate the semiconductor device 1 that has the transistor 11 and the schottky barrier diodes 10 on the same chip with a smaller number of manufacturing steps. As a result, the semiconductor device 1 can be manufactured at low cost.

As described above, when manufacturing the semiconductor device 1, the interlayer insulating film 48 that becomes the first interlayer insulating film 48A and the second interlayer insulating film 48B is formed on the entire front surface 22A of the semiconductor layer 22 (see FIG. 7G), and next, the source trenches 13 and the diode trenches 14 are formed at the same time (see FIG. 7H). It is possible to form the p$^+$ region 41 for a diode at the bottom of each diode trench 14 at the same time as forming the body contact region 33 at the bottom of each source trench 13 (see FIG. 7I). At the side walls 14B of the diode trench 14, the schottky barrier diode 10 can be formed (see FIG. 6). In this case, it is not necessary to remove the interlayer insulating film 48. When forming the source trenches 13 and the diode trenches 14, the first interlayer insulating film 48A and the second interlayer insulating film 48B can be formed in the same step (see FIG. 7H), and therefore, it is possible to reduce the number of manufacturing steps. Because the first interlayer insulating film 48A and the second interlayer insulating film 48B are both left instead of being removed, it is possible to omit the step of removing these interlayer insulating films 48.

In a plan view, the transistor forming region D surrounds the diode forming regions C (see FIGS. 1 to 4). When the transistor 11 in the transistor forming region D is ON, the schottky barrier diode 10 in the diode forming region C is turned OFF, thereby making it possible to release heat from the semiconductor layer 22 through the diode forming region C. When the transistor 11 is OFF, it is possible to release heat from the semiconductor layer 22 through the transistor forming region D. This way, it is possible to prevent the temperature of the semiconductor device 1 from increasing. In particular, by forming the transistor forming region D so as to surround the diode forming regions C, heat from one region can be released through the other region, and therefore, it is possible to effectively mitigate an increase in temperature of the semiconductor device 1. Also, because a plurality of diode forming regions C are dispersed so as to be distributed evenly with a prescribed gap therebetween, it is possible to more effectively mitigate an increase in temperature of the semiconductor device 1.

Figure 8:
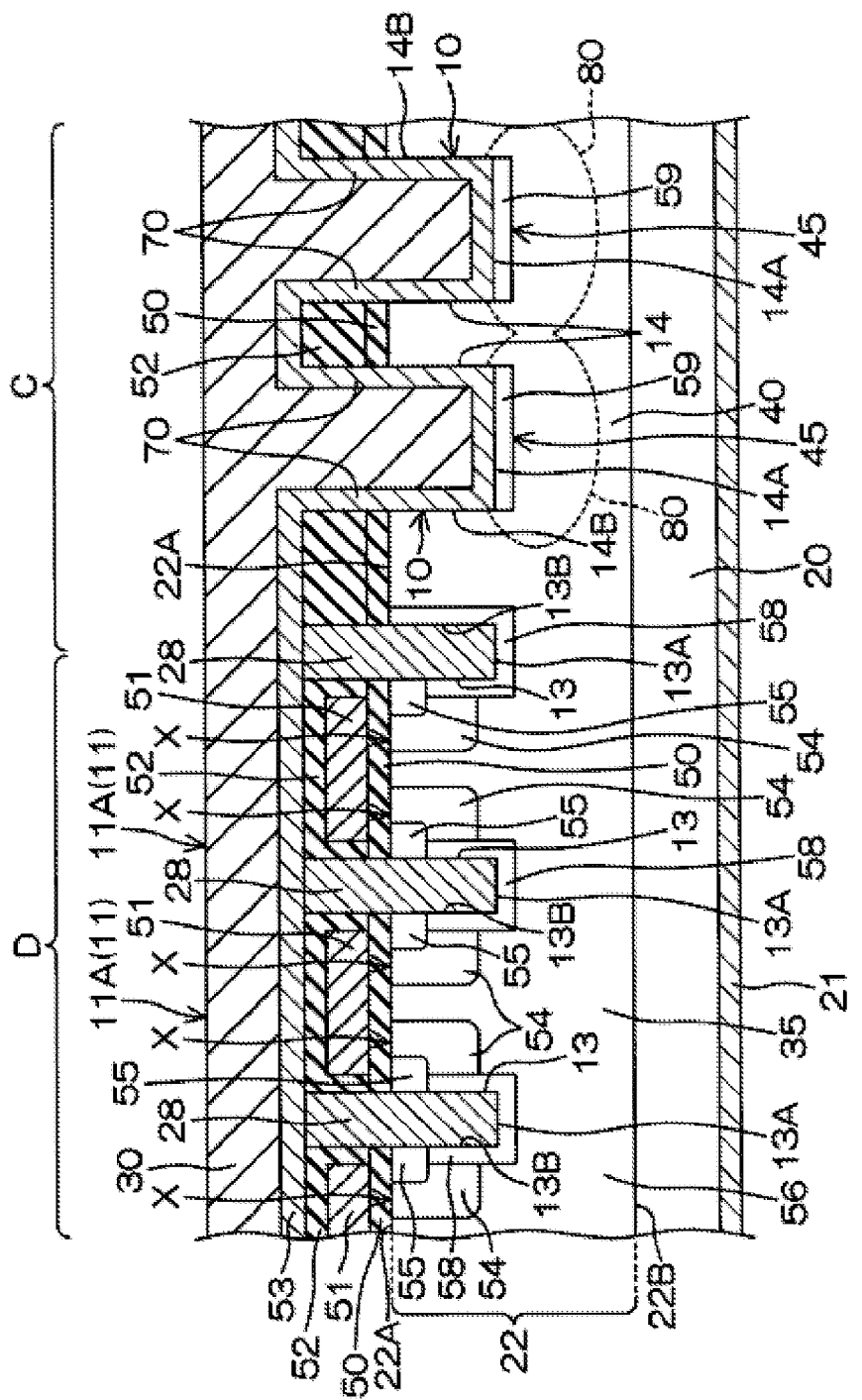
FIG. 8 is an illustrative cross-sectional view of a semiconductor device of another embodiment of the present invention.

FIG. 8 is an illustrative cross-sectional view of a semiconductor device of another embodiment of the present invention.

Next, an embodiment differing from the embodiment above will be explained. In the embodiment below, parts corresponding to the parts described in the embodiment above are given the same reference characters, and detailed descriptions thereof are omitted. In the case of FIG. 8, the transistor forming region D also surrounds the diode forming regions C in a plan view (see FIGS. 1 and 2).

A transistor 11 (transistor cells 11A) of a semiconductor device 1 shown in FIG. 8 is a planar type MOSFET that has a different structure from that of the embodiment above, and does not have the gate trench 12 described above (see FIG. 6). However, the semiconductor device 1 has the source trenches 13 and the diode trenches 14.

The semiconductor device 1 shown in FIG. 8 includes the semiconductor substrate 20, the rear electrode 21, the semiconductor layer 22, the source electrodes 28, and the conductive layer 30, which were described above, and further includes a gate insulating film 50, gate electrodes 51, an insulating film 52, and a metal film 53.

The semiconductor substrate 20 is made of an n$^+$ semiconductor. The rear electrode 21 covers the entire rear surface (lower surface in FIG. 8) of the semiconductor substrate 20, and forms an ohmic contact with the rear surface of the semiconductor substrate 20.

The semiconductor layer 22 is deposited on the front surface (upper surface in FIG. 8) of the semiconductor substrate 20 by the epitaxial growth. The semiconductor layer 22 is made of an n$^-$ semiconductor that has a lower concentration than the semiconductor substrate 20. In the semiconductor layer 22 of FIG. 8, the upper surface will be referred to as a front surface 22A and the lower surface will be referred to as a rear surface 22B. FIG. 8 shows a part of the semiconductor layer 22 near the boundary between the diode forming region C and the transistor forming region D. In the semiconductor layer 22, a diode forming region corresponding to the diode forming region C, and a transistor region 35 corresponding to the transistor forming region D are defined.

In a surface portion of the semiconductor layer 22 in the transistor forming region D, p$^-$ body regions 54 are selectively formed. The plurality of body regions 54 are dispersed throughout the surface portion of the semiconductor layer 22. In a surface portion of each body region 54, an n$^+$ source region 55 is formed. A region of the semiconductor layer 22 in the transistor forming region D, except for the body regions 54, is an n$^-$ drain region 56. On the other hand, the semiconductor layer 22 in the diode forming region C is the above-mentioned n-type region 40 for a diode, which is of an n$^-$-type.

The surfaces of the source regions 55, the surfaces of the body regions 54 where the source regions 55 are not formed, and the surface of the drain region 56 are flush with each other, forming the front surface 22A of the semiconductor layer 22 in the transistor forming region D. At the front surface 22A of the semiconductor layer 22, source regions 55 and the drain region 56 are located on both sides of the respective body regions 54, and are separated from each other with a gap (corresponding to the body region 54 between the source region 55 and the drain region 56) therebetween along the front surface 22A.

The gate insulating film 50 is made of SiO$_2$, and covers portions of the front surface 22A of the semiconductor layer 22 in the diode forming region C and the transistor forming region D. The gate insulating film 50 in the transistor forming region D is formed covering respective source regions 55 adjacent to each other with a gap therebetween at the front surface 22A of the semiconductor layer 22 in the transistor forming region D.

The gate electrodes 51 are made of polysilicon, for example, and are formed on the gate insulating film 50. Each gate electrode 51 faces through the gate insulating film 50 the surface of each body region 54 between the source region 55 and the drain region 56.

The insulating film 52 is made of $SiO_2$. The insulating film 52 covers the entire surface of each gate electrode 51 except for a portion thereof in contact with the gate insulating film 50. The insulating film 52 is connected to the gate insulating film 50.

The source trenches 13 are recessed from the front surface (upper surface in FIG. 8) of the insulating film 52, and reach the inside of the drain region 56, penetrating the insulating film 52 (between adjacent gate electrodes 51), the gate insulating film 50, and the source region 55 and the body region 54 in the semiconductor layer 22. In the body region 54 and around the bottom of each source trench 13 in the drain region 56, a $p^+$ body contact region 58 having a higher impurity concentration than the body region 54 is formed. The source electrode 28 is embedded in each source trench 13.

The diode trenches 14 are recessed from the front surface of the insulating film 52, and reach the inside of the n-type region for a diode in the semiconductor layer 22. Near the bottom surface 14A of each diode trench 14 in the n-type region for a diode (immediately below the bottom surface 14A), a p+ region 59 for a diode is formed. The p+ region 59 for a diode forms a pn junction with the n-type region for a diode, which is of the $n^-$-type.

As in the embodiment above, the source trenches 13 and the diode trenches 14 have the same depth (see FIG. 6).

The metal film 53 includes a metal that forms a schottky junction by contacting $n^-$ silicon (such as titanium, molybdenum, palladium, or titanium nitride as described above). In the transistor forming region D, the metal film 53 covers the insulating film 52 and surfaces of the source electrodes 28 that are exposed from the source trenches 13 (upper surfaces in FIG. 8). In the diode forming region C, the metal film 53 covers the entire front surface (upper surface in FIG. 8) of the insulating film 52, and is in contact with the entire inner surfaces of the diode trenches 14 (including the insulating film 52 and the gate insulating film 50 that are a part of the inner surfaces). In this state, the metal film 53 forms an ohmic contact with the $p^+$ region 59 for a diode, and forms a schottky junction with the n-type region for a diode at the side walls 14B of each diode trench 14. Portions of the metal film 53 that form a schottky junction with the n-type region for a diode constitute schottky electrodes 70.

The conductive layer 30 is formed on the metal film 53, and covers the entire front surface (upper surface in FIG. 8) of the metal film 53. The conductive layer 30 is electrically connected to corresponding electrodes out of the plurality of external electrodes 2 mentioned above (see FIGS. 1 and 2). The gate electrodes 51 are connected to other corresponding external electrodes 2 via not-shown relay wiring lines.

In the semiconductor device 1, in the transistor forming region D, the conductive layer 30, the metal film 53, the source electrodes 28, the body regions 54, and the source regions 55 are electrically connected to each other. Also, in the transistor forming region D, the rear electrode 21, the semiconductor substrate 20, and a portion of the semiconductor layer 22 where the body region 54 or the source region 55 is not formed (drain region 56) are electrically connected to each other.

This way, in the transistor forming region D, transistor cells 11A are constructed individually. In the transistor cell 11A, a parasitic diode is formed by the body region 54 and the drain region 56.

For example, in a state where the conductive layer 30 is grounded, and a positive voltage is applied to the rear electrode 21, a voltage equal to or greater than a threshold voltage is applied to the gate electrodes 51. As a result, a channel is formed in each channel region X near the boundary between the body region 54 and the gate insulating film 50, allowing an electric current to flow from the rear electrode 21 toward the conductive layer 30 via the channel.

In the diode forming region C, the rear electrode 21 forms an ohmic contact with the semiconductor substrate 20, and the metal film 53 forms a schottky junction with the semiconductor layer 22 (n-type region for a diode), thereby constituting a schottky barrier diode 10. The schottky barrier diode 10 and the transistor 11 are connected to each other in parallel. Also, in the diode forming region C, the p+ region 59 for a diode at the bottom surface 14A of each diode trench 14 forms a pn junction with the n-type region for a diode, and with the pn junction between the p+ region 59 for a diode and the n-type region for a diode, the above-mentioned pn diode 45 is constituted. As described above, in one diode trench 14, the pn diode 45 is formed at the bottom surface 14A, and the schottky barrier diode 10 is formed at the side walls 14B.

In each diode trench 14 in the diode forming region C, the schottky barrier diode 10 and the pn diode 45 are connected to each other in parallel. As described above, Vf of the schottky barrier diode 10 is lower than Vf of the pn diode 45, and therefore, an electric current flows through the schottky barrier diode 10 before the pn diode 45.

Also, as in the embodiment above (see FIG. 6), in a reverse bias state, a depletion layer 80 spreads from the pn diode 45 at the bottom of each diode trench 14, and respective depletion layers 80 at the bottom of adjacent diode trenches 14 are connected to each other.

The configuration of the semiconductor device 1 of FIG. 6 may be appropriately applied to the semiconductor device 1 of FIG. 8, and in such a case, it is possible to attain effects similar to those of the semiconductor device 1 of FIG. 6.

Figure 9:
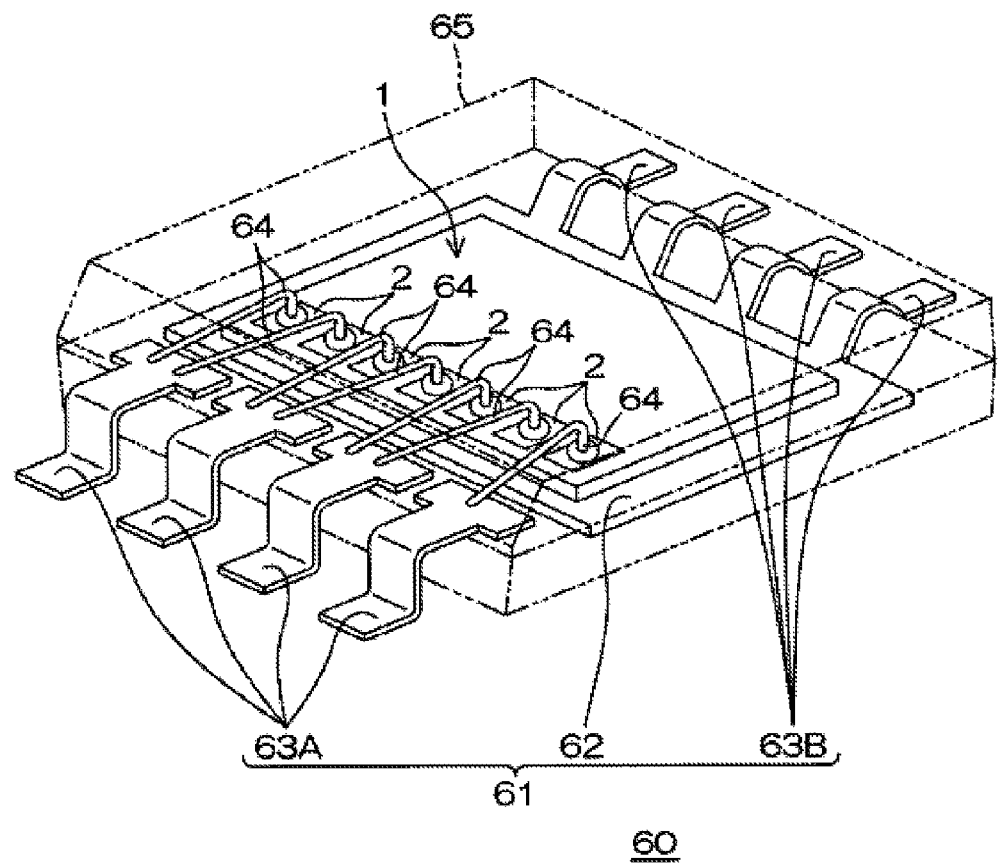
FIG. 9 is a perspective view that schematically shows a semiconductor package according to an embodiment of the present invention.

FIG. 9 is a perspective view that schematically shows a semiconductor package according to an embodiment of the present invention.

As shown in FIG. 9, a semiconductor package 60 includes any one of the above-mentioned semiconductor devices 1, a lead frame 61 made of a metal, and a resin package 65.

The semiconductor device 1 is bonded to the lead frame 61. The lead frame 61 includes a die pad 62 in a rectangular plate shape, leads 63A disposed along one side of the die pad 62 with a gap therebetween, and leads 63B extending from another side of the die pad 62. The lead frame 61 has a plurality of leads 63A and a plurality of leads 63B (four each in this example).

In the semiconductor device 1, the rear electrode 21 (see FIGS. 6 and 8) is bonded to the upper surface of the die pad 62, and each lead 63A is connected to a corresponding external electrode 2 on the surface of the semiconductor device 1 through a bonding wire 64. This way, the leads 63A and 63B are electrically connected to the schottky barrier diodes 10, the pn diodes 45, and the transistors 11 in the semiconductor device 1 (see FIGS. 1 and 2). In FIG. 9, the rightmost external electrode 2 is connected to the gate electrode 24, and other external electrodes 2 are connected to the source electrode 28 (see also FIG. 6). In this case, the rightmost lead 63A in FIG. 9 is a lead for the gate, and the other three leads 63A are leads for the source. All of the leads 63B are leads for the drain.

The semiconductor device 1 and the lead frame 61 bonded to each other are covered by the resin package 65 such that the respective leads 63A and leads 63B are exposed to the outside. The semiconductor package 60 can be connected (mounted) to a mounting wiring substrate (not shown) by having the respective leads 63A and 63B face the mounting wiring substrate.

Figure 10:
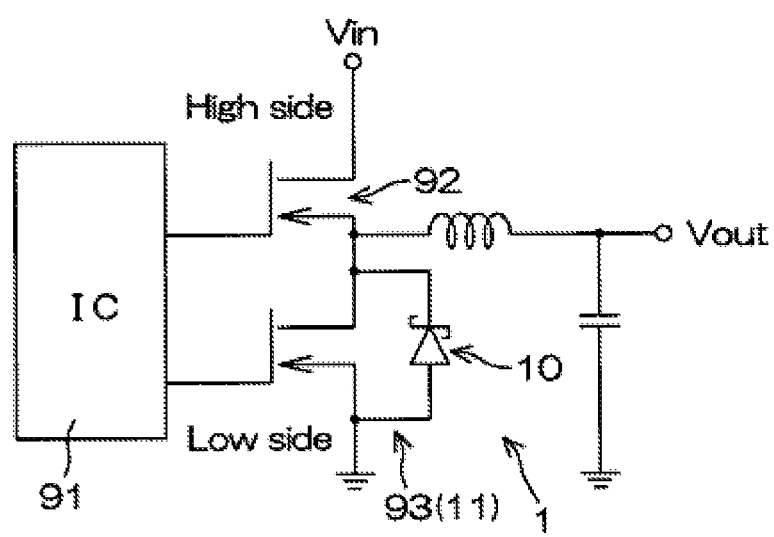
FIG. 10 is a circuit diagram of a DC-DC converter that uses the semiconductor device of the present invention.

FIG. 10 is a circuit diagram of a DC-DC converter that uses the semiconductor device of the present invention.

In a DC-DC converter 100 shown in FIG. 10, a control part (IC) 91 is connected to a high side transistor 92 and a low side transistor 93, and the semiconductor device 1 of the present invention can be used for the low side transistor 93. In this case, the transistor 11 of the semiconductor device 1 is used as the low side transistor 93, and the schottky barrier diode 10 connects the high side transistor 92 to the low side transistor 93.

In addition to the above-mentioned, the present invention can be implemented in various embodiments, and various design changes can be made without departing from the scope specified by claims.

Figure 11:
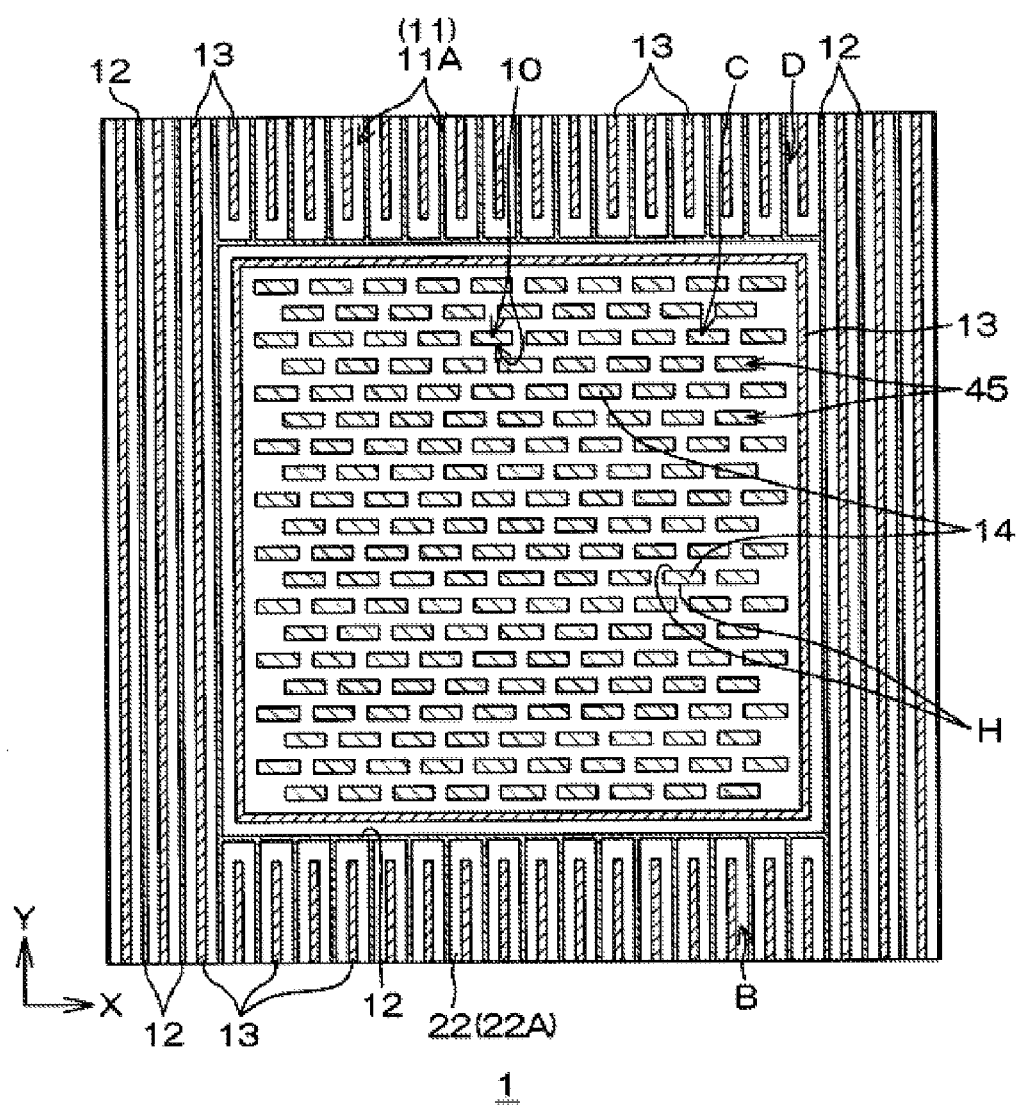
FIG. 11 is a diagram showing a modification example of a main part of the semiconductor device of FIG. 3.

FIG. 11 is a diagram showing a modification example of the main part of the semiconductor device of FIG. 3.

Each of the diode trenches 14 described above extends as a straight line over the entire region of the diode forming region C, for example (see FIGS. 3 and 4), but as shown in FIG. 11, the diode trench 14 may be divided into a plurality of parts on the same line extending along the second direction X. In this case also, as in the embodiment above, in a plan view, each diode trench 14 is formed in a rectangular shape that is longer in the second direction X. The source trenches 13 are formed in a linear shape along the first direction Y at the front surface 22A of the semiconductor layer 22 as in the embodiment above, and two parallel sides (sides extending along the second direction X) H of each diode trench 14 that is rectangular in a plan view are orthogonal to the lengthwise direction (first direction Y) of the source trench 13.

In the above embodiments, the pn diode 45 was formed at the bottom surface 14A of each diode trench 14 (see FIGS. 6 and 8), but by omitting the ion implantation on the diode trenches 14 (see FIG. 7I), the schottky barrier diode 10 may be formed not only at the side walls 14B of the diode trench 14, but also at the bottom surface 14A.

In the above embodiments, the first conductive type was n-type, and the second conductive type was p-type, but conversely, the first conductive type may be p-type, and the second conductive type may be n-type.

The thickness of the first interlayer insulating film 48A and the thickness of the second interlayer insulating film 48B may differ from each other. The depths of the gate trenches 12, the source trenches 13, and the diode trenches 14 may be changed appropriately. It is preferable that the source trenches 13 and the diode trenches 14 be orthogonal to each other in a plan view, but the intersection angle of these trenches does not necessarily have to be 90°.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A manufacturing method of a semiconductor device, comprising:

forming, in a semiconductor layer of a first conductive type in which a transistor region and a diode region are respectively defined, a body region of a second conductive type in said transistor region, and leaving said diode region as a first conductive type region for a diode;

forming a source region and a drain region of the first conductive type in the semiconductor layer so as to be separated from each other across the body region;

forming both a source trench in the semiconductor layer and a diode trench in the diode region at the same time, the source trench reaching the body region through the source region;

injecting an impurity ion into the semiconductor layer near a bottom of the source trench and near a bottom of the diode trench to form, at the same time, a body contact region near the bottom of the source trench and in the semiconductor layer that includes the body region, and a second conductive type region for a diode in the semiconductor layer near the bottom of the diode trench, the body contact region being the second conductive type and having a higher impurity concentration than that of the body region, the second conductive type region for a diode having the second conductive type and forming a pn junction with the first conductive type region for a diode;

forming a gate electrode facing through a gate insulating layer the body region that lies between the source region and the drain region; and embedding a source electrode in the source trench at the same time as forming a schottky electrode that forms a schottky junction with the first conductive type region for a diode at side walls of the diode trench.

2. The manufacturing method of a semiconductor device according to claim 1, further comprising, before forming the source electrode and the schottky electrode, forming a first interlayer insulating film for insulating the gate electrode and the source electrode from each other at the same time as forming a second interlayer insulating film that is to be interposed between the schottky electrode and a surface of the first conductive type region for a diode outside of the diode trench.

3. The manufacturing method of a semiconductor device according to claim 1, wherein a plurality of said diode trenches are formed in the diode region with a gap therebetween, and wherein the gap between the plurality of diode trenches is set such that a depletion layer spreading from each said pn junction is connected to one another in a reverse bias state.

4. The manufacturing method of a semiconductor device according to claim 1, wherein the source trench is formed at a surface of the semiconductor layer in a linear shape along a first direction, and wherein the diode trench is formed at the surface of the semiconductor layer in a linear shape along a second direction that is orthogonal to the first direction.

5. The manufacturing method of a semiconductor device according to claim 1, wherein the source trench is formed at a surface of the semiconductor layer in a linear shape, and wherein the diode trench is formed to be rectangular in a plan view, and two parallel sides of the diode trench that is rectangular in a plan view are orthogonal to a lengthwise direction of the source trench.

* * * * *